US011152924B2

(12) United States Patent
Lee et al.

(10) Patent No.: US 11,152,924 B2
(45) Date of Patent: Oct. 19, 2021

(54) LEVEL SHIFTER AND OPERATING METHOD OF LEVEL SHIFTER

(71) Applicant: SAMSUNG ELECTRONICS CO., LTD., Suwon-si (KR)

(72) Inventors: Kwang Chan Lee, Hwaseong-si (KR); Hyoungseok Oh, Seoul (KR); Jungwook Heo, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/910,261

(22) Filed: Jun. 24, 2020

(65) Prior Publication Data
US 2021/0159891 A1 May 27, 2021

(30) Foreign Application Priority Data
Nov. 26, 2019 (KR) .......... 10-2019-0153711

(51) Int. Cl.
H03K 19/0175 (2006.01)
H03K 3/356 (2006.01)
H03K 19/0185 (2006.01)

(52) U.S. Cl.
CPC . *H03K 3/356182* (2013.01); *H03K 3/356113* (2013.01); *H03K 19/017509* (2013.01); *H03K 19/018507* (2013.01); *H03K 19/018521* (2013.01)

(58) Field of Classification Search
CPC ....... H03K 3/356017; H03K 3/356086; H03K 3/356182; H03K 3/356113; H03K 3/35613; H03K 19/0175; H03K 19/017509; H03K 19/0185; H03K 19/018507;
(Continued)

(56) References Cited

U.S. PATENT DOCUMENTS

| 6,445,210 B2 | 9/2002 | Nojiri |
| 7,161,405 B2 | 1/2007 | Noguchi |
| 7,199,617 B1 | 4/2007 | Schrom et al. |

(Continued)

FOREIGN PATENT DOCUMENTS

| JP | 2003243969 A | 8/2003 |
| KR | 1019990053194 A | 7/1999 |

OTHER PUBLICATIONS

Yashodhan Moghe et al., "Nanosecond Delay Floating High Voltage Level Shifters in a 0.35 HV-CMOS Technology", IEEE Journal of Solid-State Circuits, vol. 46, No. 2, Feb. 2011.

*Primary Examiner* — Long Nguyen
(74) *Attorney, Agent, or Firm* — Volentine, Whitt & Francos, PLLC

(57) ABSTRACT

A level shifter including an input block that receives an input voltage swinging between a first ground voltage and a first power supply voltage and that connects one node of a first node and a second node to a first ground node, in response to the input voltage, a shifting block that mutually exchanges the voltage levels of third and fourth nodes in response to a current flowing through the one node, a pulse generator that generates a first pulse and a second pulse in response to the input voltage, a first transistor that directly connects the third node to the first ground node in response to the first pulse, and a second transistor that directly connects the fourth node to the first ground node in response to the second pulse.

19 Claims, 24 Drawing Sheets

(58) Field of Classification Search
CPC ... H03K 19/018514; H03K 19/018521; H03K 19/018528
See application file for complete search history.

(56) References Cited

U.S. PATENT DOCUMENTS

| | | | |
|---|---|---|---|
| 7,471,105 B2 | 12/2008 | Kim | |
| 8,334,709 B2 | 12/2012 | Kuge | |
| 8,575,986 B2 * | 11/2013 | Sumitomo | H03K 3/356165 |
| | | | 327/333 |
| 8,704,579 B2 * | 4/2014 | Chen | H03K 3/356113 |
| | | | 327/333 |
| 8,847,660 B2 | 9/2014 | Takiba et al. | |
| 2013/0154713 A1 * | 6/2013 | Wang | H03K 3/356113 |
| | | | 327/333 |

* cited by examiner

LEVEL SHIFTER AND OPERATING METHOD OF LEVEL SHIFTER

CROSS-REFERENCE TO RELATED APPLICATIONS

A claim for priority under 35 U.S.C. § 119 is made to Korean Patent Application No. 10-2019-0153711 filed on Nov. 26, 2019, in the Korean Intellectual Property Office, the entirety of which is hereby incorporated by reference.

BACKGROUND

The present inventive concepts described herein relate to level shifters, and more particularly to level shifters having improved performance and improved reliability, and operating methods of level shifters.

Electronic devices may include various elements that operate in a same voltage domain or that may operate in different voltage domains. Elements belonging to a same voltage domain may operate using a same power supply voltage and a same ground voltage. Elements belonging to different voltage domains may operate using different power supply voltages and different ground voltages.

Level shifters may be used to exchange signals between elements belonging to different voltage domains. Level shifters may convert a signal (e.g., a signal swinging between one power supply voltage and one ground voltage) belonging to one voltage domain into a signal (e.g., a signal swinging between another power supply voltage and another ground voltage) belonging to another voltage domain.

SUMMARY

Embodiments of the inventive concept provide a level shifter which operates at improved speed and operates even at low voltages, and an operating method of the level shifter.

Embodiments of the inventive concepts provide a level shifter including an input block that receives an input voltage swinging between a first ground voltage and a first power supply voltage, and that connects one node of a first node and a second node of the input block to a first ground node at which the first ground voltage is supplied in response to the input voltage; a shifting block that stores complementary voltage levels swinging between a second ground voltage and a second power supply voltage at a third node and a fourth node of the shifting block, and mutually exchanges the complementary voltage levels of the third and fourth nodes with each other in response to a current flowing through the one node; a pulse generator that generates a first pulse and a second pulse in response to the input voltage; a first transistor that directly connects the third node to the first ground node in response to the first pulse; and a second transistor that directly connects the fourth node to the first ground node in response to the second pulse.

Embodiment of the inventive concepts further provide a level shifter including an input block that receives an input voltage swinging between a first ground voltage and a first power supply voltage, and connects one node of a first node and a second node of the input block to a first power node at which the first power supply voltage is supplied in response to the input voltage; a shifting block that stores complementary voltage levels swinging between a second ground voltage and a second power supply voltage at a third node and a fourth node of the shifting block, and mutually exchanges the complementary voltage levels of the third and fourth nodes with each other in response to a current flowing through the one node; a pulse generator that generates a first pulse and a second pulse in response to the input voltage; a first transistor that directly connects the third node to the first power node in response to the first pulse; and a second transistor that directly connects the fourth node to the first power node in response to the second pulse.

Embodiments of the inventive concepts still further provide an operating method of a level shifter including an input block, a latch, a pulse generator and an output block. The operating method includes receiving at the input block an input voltage swinging between a first ground voltage and a first power supply voltage; providing by the input block a continuous current flow at a first node of the latch and storing voltages swinging between a second ground voltage and a second power supply voltage at the first node in response to a first edge of the input voltage, and directly biasing the first node by the pulse generator during a first time period; providing by the input block a continuous current flow at a second node of the latch and storing voltages swinging between a second ground voltage and a second power supply voltage at the second node in response to a second edge of the input voltage, and directly biasing the second node during a second time period; and outputting by the output block a voltage level of one of the first node and the second node.

Embodiments of the inventive concepts also provide a level shifter including an input block that receives an input voltage swinging between a first ground voltage and a first power supply voltage, and selectively outputs a current responsive to the input voltage; a shifting block that stores complementary voltage levels swinging between a second ground voltage and a second power supply voltage at first and second nodes of the shifting block in response to the selectively output current; and a bias circuit that biases the first node at rising edges of the input voltage and biases the second node at falling edges of the input voltage.

BRIEF DESCRIPTION OF THE FIGURES

The above and other objects and features of the inventive concepts will become apparent in view of the following detailed description of exemplary embodiments as taken with reference to the accompanying drawings.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
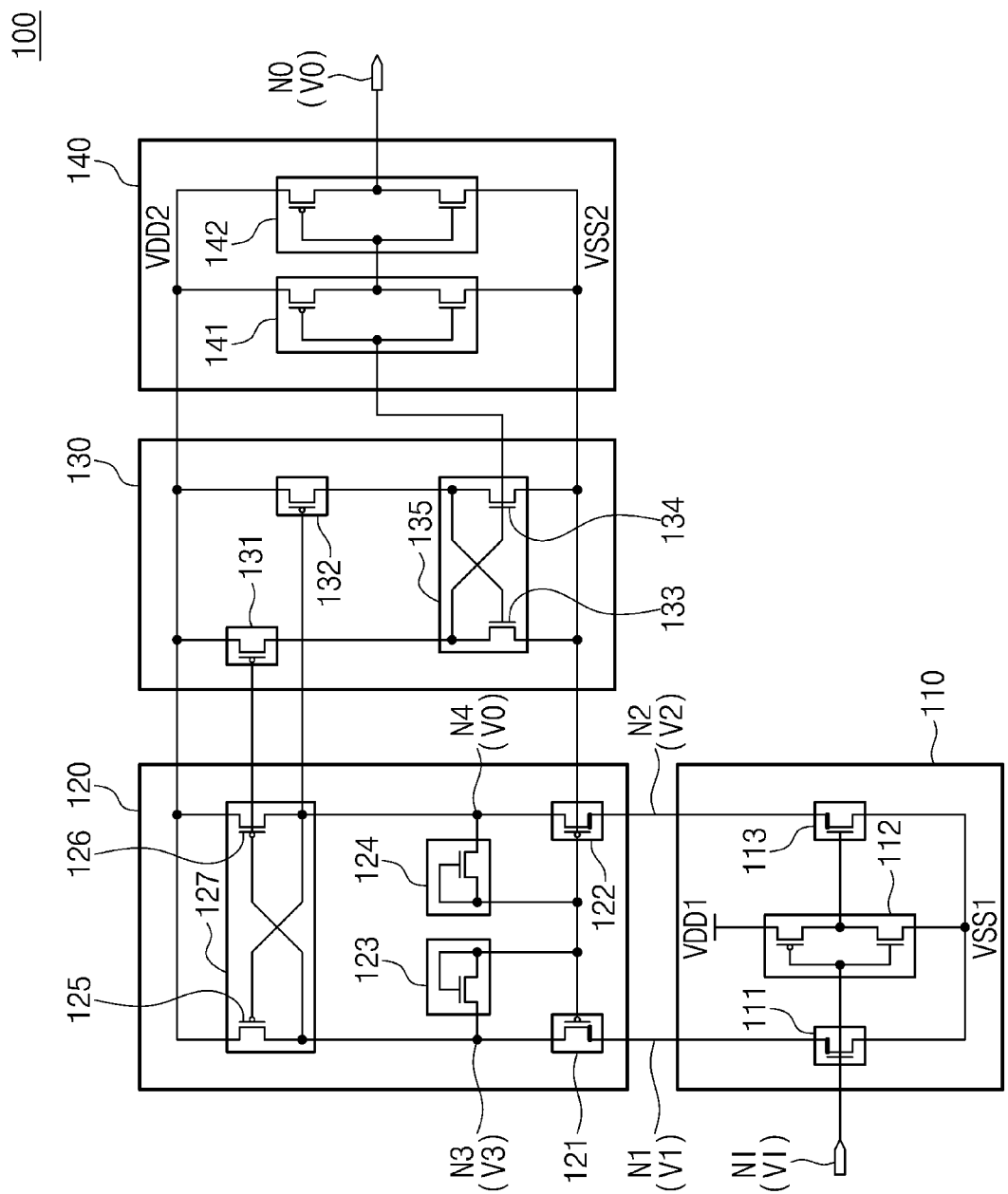
FIG. 1 illustrates a level shifter according to an embodiment of the inventive concepts.

FIG. 1 illustrates a level shifter 100 according to an embodiment of the inventive concepts. Referring to FIG. 1, level shifter 100 includes input block 110, shifting block 120, signal transfer block 130, and output block 140. Level shifter 100 may convert an input voltage VI based on a voltage domain of (or defined by) a first power supply voltage VDD1 and a first ground voltage VSS1 into an output voltage VO based on a voltage domain of (or defined by) a second power supply voltage VDD2 and a second ground voltage VSS2.

The input voltage VI may be a signal that swings between the first power supply voltage VDD1 and the first ground voltage VSS1. The output voltage VO may be a signal that swings between the second power supply voltage VDD2 and the second ground voltage VSS2. The second power supply voltage VDD2 may be a higher voltage than the first power supply voltage VDD1, and the second ground voltage VSS2 may be a higher voltage than the first ground voltage VSS1.

Level shifter 100 may receive the input voltage VI at an input node NI. The input voltage VI of input node NI may be transferred to input block 110. Input block 110 includes first input transistor 111 that receives the input voltage VI, input inverter 112 that receives the input voltage VI and inverts the input voltage VI and outputs a corresponding voltage, and second input transistor 113 that receives an output of input inverter 112. That is, second input transistor 113 receives an inversion signal of the input voltage VI (i.e., an inverted version of the input voltage VI).

First input transistor 111 is connected between a first node N1 and a first ground node to which the first ground voltage VSS1 is supplied. A voltage of the first node N1 may be a first voltage VI. Second input transistor 113 is connected between a second node N2 and the first ground node. A voltage of the second node N2 may be a second voltage V2. Input inverter 112 is connected between a first power node to which the first power supply voltage VDD1 is supplied and the first ground node.

When the input voltage VI is at a high level (e.g., is the first power supply voltage VDD1), first input transistor 111 drains a current from the first node N1 to the first ground node. When the input voltage VI is at a low level (e.g., is the first ground voltage VSS1), second input transistor 113 drains a current from the second node N2.

Shifting block 120 is connected with the first node N1 and the second node N2. When a current is drained through the first node N1 and a current is drained through the second node N2 (e.g., alternately), shifting block 120 generates a voltage that swings between the second power supply voltage VDD2 and the second ground voltage VSS2 in synchronization with swing timings of the input voltage VI.

Shifting block 120 includes first shifting transistor 121 that operates in response to the second ground voltage VSS2 and that is connected between the first node N1 and a third node N3, and second shifting transistor 122 that operates in response to the second ground voltage VSS2 and that is connected between the second node N2 and a fourth node N4.

Shifting block 120 further includes third shifting transistor 123 that is connected between a second ground node to which the second ground voltage VSS2 is supplied and the third node N3 and that has a gate connected with the second ground node, and fourth shifting transistor 124 that is connected between the second ground node and the fourth node N4 and that has a gate connected with the second ground node.

Shifting block 120 further includes shifting latch 127. Shifting latch 127 includes fifth shifting transistor 125 that is connected between a second power node to which the second power supply voltage VDD2 is supplied and the third node N3 and that has a gate connected with the fourth node N4, and sixth shifting transistor 126 that is connected between the second power node and the fourth node N4 and that has a gate connected with the third node N3.

Each of third shifting transistor 123 and fourth shifting transistor 124 may operate as a diode. Third shifting transistor 123 may apply the second ground voltage VSS2, for example the voltage obtained by subtracting a threshold voltage of third shifting transistor 123 from the second ground voltage VSS2, to the third node N3.

Third shifting transistor 123 may thus control a third voltage V3 of the third node N3 such that the third voltage V3 is not lower than the second ground voltage VSS2, for example the voltage obtained by subtracting a threshold voltage of third shifting transistor 123 from the second ground voltage VSS2. Likewise, fourth shifting transistor 124 may control a fourth voltage V4 of the fourth node N4 such that the fourth voltage V4 is not lower than the second ground voltage VSS2, for example the voltage obtained by subtracting a threshold voltage of fourth shifting transistor 124 from the second ground voltage VSS2.

First shifting transistor 121 may separate the voltage domain of shifting latch 127 from the voltage domain of input block 110 such that first input transistor 111 operates at voltages equal to or lower than the first power supply voltage VDD1 and such that shifting latch 127 operates at the second ground voltage VSS2, for example a voltage equal to or higher than the voltage obtained by subtracting the threshold voltage of third shifting transistor 123 from the second ground voltage VSS2. Likewise, second shifting transistor 122 may separate the voltage domain of input block 110 from the voltage domain of shifting latch 127.

Because the third voltage V3 of the third node N3 and the fourth voltage V4 of the fourth node N4 are not lower than subtraction voltages respectively obtained by subtracting the threshold voltages of third shifting transistor 123 and fourth shifting transistor 124 from the second ground voltage VSS2, shifting latch 127 may operate in the voltage domain based on the second ground voltage VSS2 and the second power supply voltage VDD2.

The third voltage V3 of the third node N3 or the fourth voltage V4 of the fourth node N4 may thus belong to a range from the second power supply voltage VDD2 to the second ground voltage VSS2. First shifting transistor 121 and first input transistor 111 may be biased by the second power supply voltage VDD2 and the first ground voltage VSS1. That is, first shifting transistor 121 and first input transistor 111 may experience stress due to high voltage.

To endure the high-voltage stress, first shifting transistor 121 and first input transistor 111 may be implemented with high-voltage transistors. For example, first shifting transistor 121 may be a lateral diffusion PMOS (LDPMOS) transistor, and first input transistor 111 may be a lateral diffusion NMOS (LDNMOS) transistor. Likewise, second shifting transistor 122 may be an LDPMOS transistor, and second input transistor 113 may be an LDNMOS transistor.

When the input voltage VI is at the high level (e.g., is the first power supply voltage VDD1), first input transistor 111 may drain a current from the first node N1. When first input transistor 111 drains the current from the first node N1, the third voltage V3 of the third node N3 may decrease (e.g., to the low level of the second ground voltage VSS2). As the third voltage V3 of the third node N3 decreases, sixth shifting transistor 126 of shifting latch 127 may be turned on.

As sixth shifting transistor 126 is turned on, the fourth voltage V4 of the fourth node N4 may increase (e.g., to the high level of the second power supply voltage VDD2). As the fourth voltage V4 increases, fifth shifting transistor 125 of the shifting latch 127 may be turned off. That is, when the input voltage VI is at the high level (e.g., is the first power supply voltage VDD1), the third node N3 may store the low level (e.g., the second ground voltage VSS2), and the fourth node N4 may store the high level (e.g., the second power supply voltage VDD2).

When the input voltage VI is at the low level (e.g., is the first ground voltage VSS1), second input transistor 113 may drain a current from the second node N2. When second input transistor 113 drains the current from the second node N2, the fourth voltage V4 of the fourth node N4 may decrease (e.g., to the low level of the second ground voltage VSS2).

As the fourth voltage V4 of the fourth node N4 decreases, fifth shifting transistor 125 of shifting latch 127 may be turned on.

As fifth shifting transistor 125 is turned on, the third voltage V3 of the third node N3 may increase (e.g., to the high level of the second power supply voltage VDD2). As the third voltage V3 increases, sixth shifting transistor 126 of shifting latch 127 may be turned off. That is, when the input voltage VI is at the low level (e.g., is the first ground voltage VSS1), the third node N3 may store the high level (e.g., the second power supply voltage VDD2), and the fourth node N4 may store the low level (e.g., the second ground voltage VSS2).

That is, when the input voltage VI swings between the high level of the first power supply voltage VDD1 and the low level of the first ground voltage VSS1, the third voltage V3 of the third node N3 may swing between the low level of the second ground voltage VSS2 and the high level of the second power supply voltage VDD2, and the fourth voltage V4 of the fourth node N4 may swing between the high level of the second power supply voltage VDD2 and the low level of the second ground voltage VSS2.

Signal transfer block 130 may transfer the third voltage V3 of the third node N3 and the fourth voltage V4 of the fourth node N4. Signal transfer block 130 includes first signal transfer transistor 131, second signal transfer transistor 132, and signal transfer latch 135.

First signal transfer transistor 131 is connected between the second power node and a first end of signal transfer latch 135 and may operate in response to the third voltage V3 of the third node N3. Second signal transfer transistor 132 is connected between the second power node and a second end of signal transfer latch 135 and may operate in response to the fourth voltage V4 of the fourth node N4.

Signal transfer latch 135 includes third signal transfer transistor 133 that is connected between the first end of signal transfer latch 135 and the second ground node and that has a gate connected with the second end of signal transfer latch 135, and fourth signal transfer transistor 134 that is connected between the second end of signal transfer latch 135 and the second ground node and that has a gate connected with the first end of signal transfer latch 135.

First signal transfer transistor 131 may supply a current to the first end of signal transfer latch 135 in response to the third voltage V3 of the third node N3. Second signal transfer transistor 132 may supply a current to the second end of signal transfer latch 135 in response to the fourth voltage V4 of the fourth node N4. A voltage at the first end of signal transfer latch 135 may follow a change in the fourth voltage V4 of the fourth node N4, and a voltage at the second end of signal transfer latch 135 may follow a change in the third voltage V3 of the third node N3.

Output block 140 includes first output inverter 141 and second output inverter 142 that are both connected between the second ground node and the second power node. First output inverter 141 has an input that is connected to the first end of signal transfer latch 135. Second output inverter 142 has an input that is connected to an output of first output inverter 141. An output of second output inverter 142 is connected with an output node NO and may be output as the output voltage VO.

In an embodiment, signal transfer block 130 may be omitted. In the case where signal transfer block 130 is omitted, output block 140 may be modified to receive the fourth voltage V4 of the fourth node N4 at the input of first output inverter 141. In another embodiment, for example at least one inverter may be added between signal transfer block 130 and shifting block 120. Also, in other embodiments output block 140 may be modified to include one inverter. In still further embodiments, output block 140 may include at least one inverter in addition to first output inverter 141 and second output inverter 142.

In the embodiment of FIG. 1, a next stage (e.g., signal transfer block 130 and output block 140) of shifting block 120 may receive the third voltage V3 of the third node N3 or the fourth voltage V4 of the fourth node N4 as an input. The next stage of shifting block 120 may be configured to output the output voltage VO following a voltage change of the input voltage VI.

The output voltage VO of level shifter 100 may follow the voltage change of the input voltage VI. To this end, the first voltage V1 of the first node N1 may complementarily follow the voltage change of the input voltage VI, the second voltage V2 of the first node N2 may complementarily follow the voltage change of the input voltage VI.

When the input voltage VI transitions from the low level to the high level, the first node N1 is directly connected with the first ground node through first input transistor 111. Accordingly, the first voltage V1 of the first node N1 may be quickly discharged to the first ground voltage VSS1.

In contrast, when the input voltage VI transitions from the high level to the low level, the first node N1 may transition to the high level by a current transferred from the second power node through fifth shifting transistor 125 and first shifting transistor 121. As mentioned above, first input transistor 111 and first shifting transistor 121 may respectively be an LDNMOS transistor and an LDPMOS transistor.

The sizes of the LDNMOS transistor and the LDPMOS transistor are larger than the sizes of a typical NMOS transistor and a typical PMOS transistor, and the capacitances of the LDNMOS transistor and the LDPMOS transistor are greater than the capacitances of a typical NMOS transistor and a typical PMOS transistor. Accordingly, a time necessary for the first voltage V1 of the first node N1 to transition from the low level to the high level is longer than a time necessary for the first voltage V1 to transition from the high level to the low level.

Likewise, a time necessary for the second voltage V2 of the second node N2 to transition from the low level to the high level is longer than a time necessary for the second voltage V2 to transition from the high level to the low level. This asymmetry may cause a decrease in a speed of level shifter 100 and reduction of reliability.

When the input voltage VI transitions from the low level to the high level, the first node N1 may quickly transition to the low level. When the first voltage V1 of the first node N1 is at the low level, the third voltage V3 of the third node N3 may start to decrease. When the third voltage V3 of the third node N3 is at the low level, sixth shifting transistor 126 may be turned on, and the fourth voltage V4 of the fourth node N4 may start to increase.

However, as mentioned above, the capacitance of first shifting transistor 121 is greater than capacitances of other transistors. Accordingly, the third voltage V3 of the third node N3 may slowly fall (compared to the case where first shifting transistor 121 is a typical PMOS transistor and not an LDPMOS transistor), and the timing when a voltage of the fourth node N4 starts to increase may be delayed. Accordingly, the timing when a voltage of the second node N2 starts to increase may also be delayed.

As described above, level shifter 100 may use an LDPMOS transistor or an LDNMOS transistor for the purpose of enduring high-voltage stress. However, the use of an LDPMOS transistor or an LDNMOS transistor may cause a decrease in an operating speed of level shifter 100 and reduction of reliability.

Figure 2:
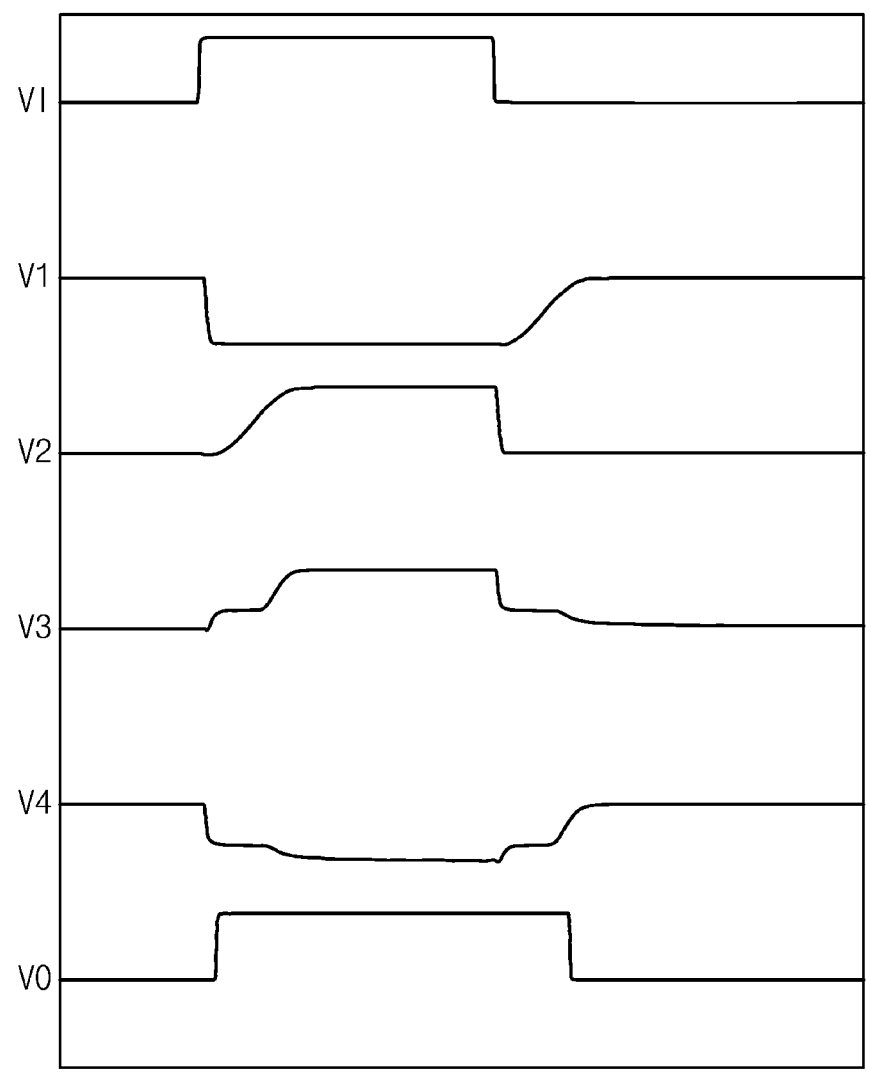
FIG. 2 illustrates an example in which voltages of the level shifter of FIG. 1 change.

FIG. 2 illustrates an example in which voltages of level shifter 100 of FIG. 1 change. In FIG. 2, the horizontal axis represents time, and the vertical axis represents voltage levels of signals. FIG. 2 shows a simulation result when a difference between the second power supply voltage VDD2 and the second ground voltage VSS2 is 4.5 V, and when the first power supply voltage VDD1 is 4.8 V.

Referring to FIGS. 1 and 2, the input voltage VI, the first voltage V1 of the first node N1, the second voltage V2 of the second node N2, the third voltage V3 of the third node N3, the fourth voltage V4 of the fourth node N4, and the output voltage VO are illustrated.

As illustrated in FIG. 2, when the input voltage VI transitions from the low level to the high level, the first voltage V1 transitions from the high level to the low level relatively quickly. In contrast, the second voltage V2 transitions from the low level to the high level relatively slowly. As the second voltage V2 transitions from the low level to the high level relatively slowly, changes of the third voltage V3 and the fourth voltage V4 may be delayed, and the timing when the output voltage VO transitions from the low level to the high level may be delayed with respect to the timing when the input voltage VI transitions from the low level to the high level.

Likewise, when the input voltage VI transitions from the high level to the low level, the second voltage V2 transitions from the high level to the low level relatively quickly. In contrast, the first voltage V1 transitions from the low level to the high level relatively slowly. As the first voltage V1 transitions from the low level to the high level relatively slowly, changes of the third voltage V3 and the fourth voltage V4 may be delayed, and the timing when the output voltage VO transitions from the high level to the low level may be delayed with respect to the timing when the input voltage VI transitions from the high level to the low level.

Figure 3:
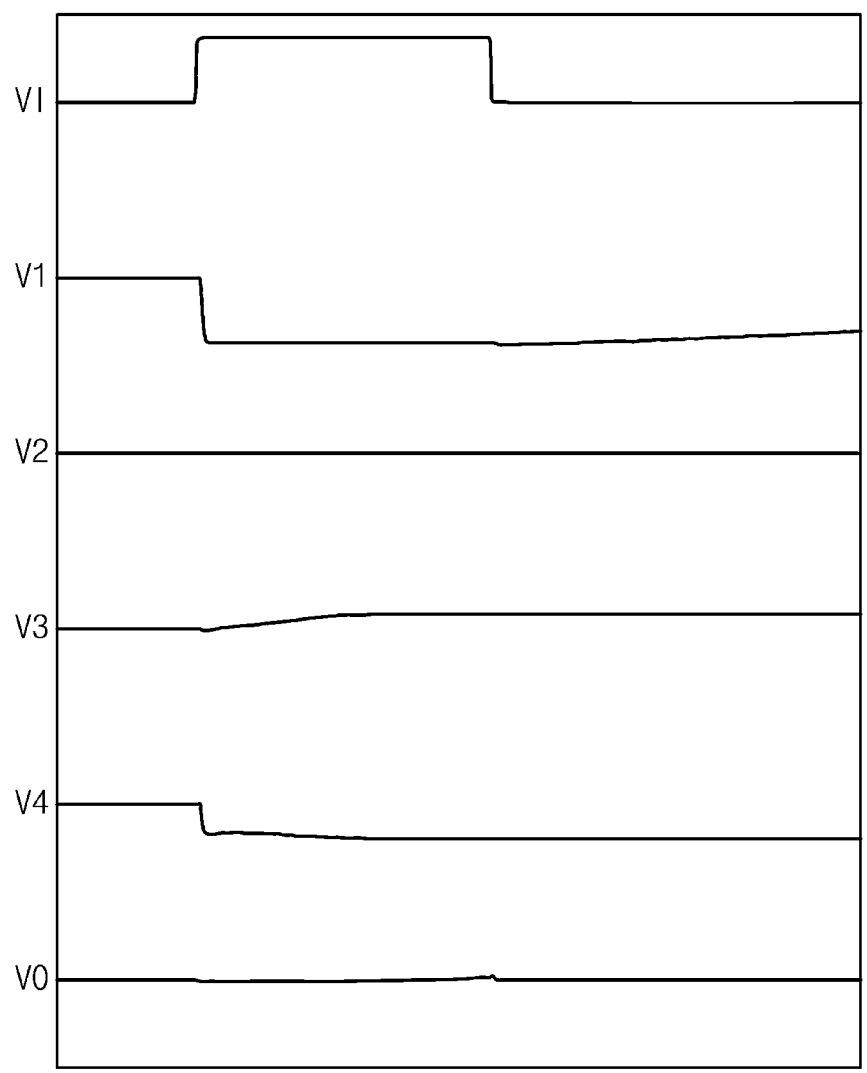
FIG. 3 illustrates another example in which voltages of the level shifter of FIG. 1 change.

FIG. 3 illustrates another example in which voltages of level shifter 100 of FIG. 1 change. FIG. 3 shows a simulation result when a difference between the second power supply voltage VDD2 and the second ground voltage VSS2 is 2 V, and when the first power supply voltage VDD1 is 2 V.

Referring to FIGS. 1 and 3, the input voltage VI, the first voltage V1 of the first node N1, the second voltage V2 of the second node N2, the third voltage V3 of the third node N3, the fourth voltage V4 of the fourth node N4, and the output voltage VO are illustrated.

Referring to FIGS. 1 and 3, when the input voltage VI transitions from the low level to the high level, the first voltage V1 transitions from the high level to the low level. However, the second voltage V2 may fail to transition to the high level. As the second voltage V2 fails to transition to the high level, the third voltage V3 and the fourth voltage V4 also fail to transition, and level shifter 100 may operate abnormally.

As described above, the capacitances of first shifting transistor 121 and second shifting transistor 122 may delay an operation of level shifter 100 or may cause an abnormal operation of level shifter 100.

Figure 4:
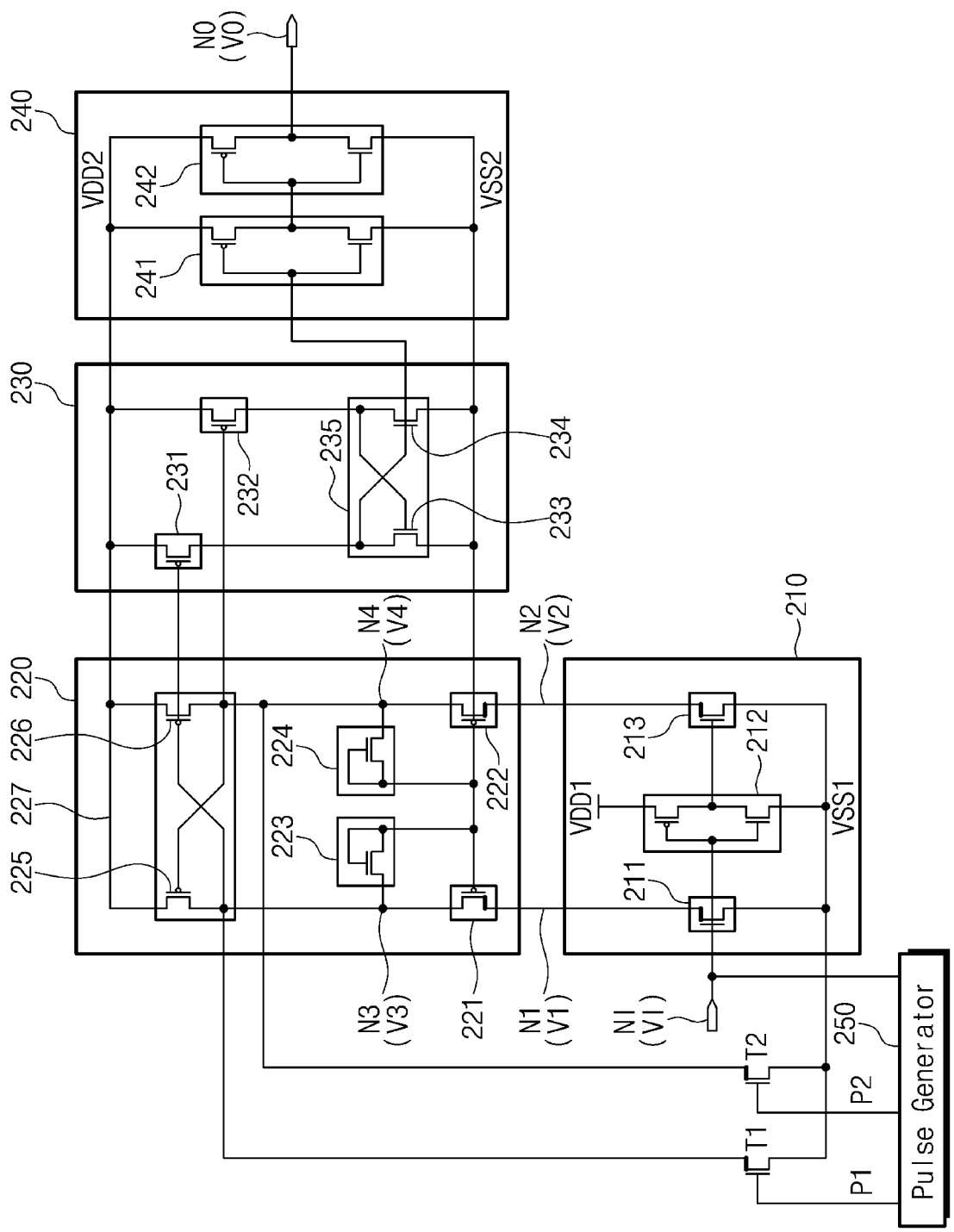
FIG. 4 illustrates a level shifter according to an embodiment of the inventive concepts.

FIG. 4 illustrates level shifter 200 according to a second embodiment of the inventive concepts. Referring to FIG. 4, level shifter 200 includes input block 210, shifting block 220, signal transfer block 230, and output block 240. Level shifter 200 may convert the input voltage VI based on the voltage domain of the first power supply voltage VDD1 and the first ground voltage VSS1 into the output voltage VO based on the voltage domain of the second power supply voltage VDD2 and the second ground voltage VSS2.

Input block 210 includes first input transistor 211, input inverter 212, and second input transistor 213. The structure and operation of input block 210 are identical to the structure and operation of input block 110 of FIG. 1. Accordingly, description of input block 210 that is the same as the description of input block 110 of FIG. 1 is omitted to avoid redundancy.

Shifting block 220 includes first shifting transistor 221, second shifting transistor 222, third shifting transistor 223, fourth shifting transistor 224, and shifting latch 227. Shifting latch 227 includes fifth shifting transistor 225 and sixth shifting transistor 226.

The structure and operation of shifting block 220 are identical to the structure and operation of shifting block 120 of FIG. 1, except that shifting block 220 is connected to first transistor T1 and second transistor T2. Description of shifting block 220 that is the same as the description of shifting block 120 of FIG. 1 will be omitted from the following to avoid redundancy.

Signal transfer block 230 includes first signal transfer transistor 231, second signal transfer transistor 232, and signal transfer latch 235. Signal transfer latch 235 includes third signal transfer transistor 233 and fourth signal transfer transistor 234. The structure and operation of signal transfer block 230 are identical to the structure and operation of signal transfer block 130 of FIG. 1. Accordingly, description of signal transfer block 230 that is the same as the description of signal transfer block 130 is omitted to avoid redundancy.

Output block 240 includes first output inverter 241 and second output inverter 242. The structure and operation of output block 240 are identical to the structure and operation of the output block 140 of FIG. 1. Accordingly, description of output block 240 that is the same as the description of output block 140 is omitted to avoid redundancy.

Compared with level shifter 100 of FIG. 1, level shifter 200 further includes first transistor T1, second transistor T2, and pulse generator 250. Each of first transistor T1 and second transistor T2 may be an LDNMOS transistor. First transistor T1 is connected between the third node N3 and the first ground node to which the first ground voltage VSS1 is supplied. First transistor T1 may directly connect the third node N3 to the first ground node temporarily in response to a first pulse signal P1 transferred from pulse generator 250.

Second transistor T2 is connected between the fourth node N4 and the first ground node. Second transistor T2 may directly connect the fourth node N4 to the first ground node temporarily in response to a second pulse signal P2 transferred from pulse generator 250. Each of the first pulse signal P1 and the second pulse signal P2 may be a one-shot pulse that temporarily has an active level (e.g., the high level or the low level) and then has an inactive level (e.g., the low level or the high level).

Accordingly, first transistor T1 may directly connect the third node N3 to the first ground node temporarily in response to the first pulse signal P1. Also, second transistor T2 may directly connect the fourth node N4 to the first ground node temporarily in response to the second pulse signal P2. First transistor P1, second transistor P2 and pulse generator 250 may together be characterized as a bias circuit.

A time period during which first and second transistors T1 and T2 are temporarily turned on to respectively connect the third node N3 and the fourth node N4 to the first ground node may be, for example, a time period shorter than a duty time in which the input voltage VI swings. The duty time may be a time period in which a signal periodically swinging between the high level and the low level has the high level (or the low level).

Pulse generator 250 receives the input voltage VI from the input node NI. Pulse generator 250 generates the first pulse signal P1 and the second pulse signal P2 in response to the input voltage VI.

Figure 5:
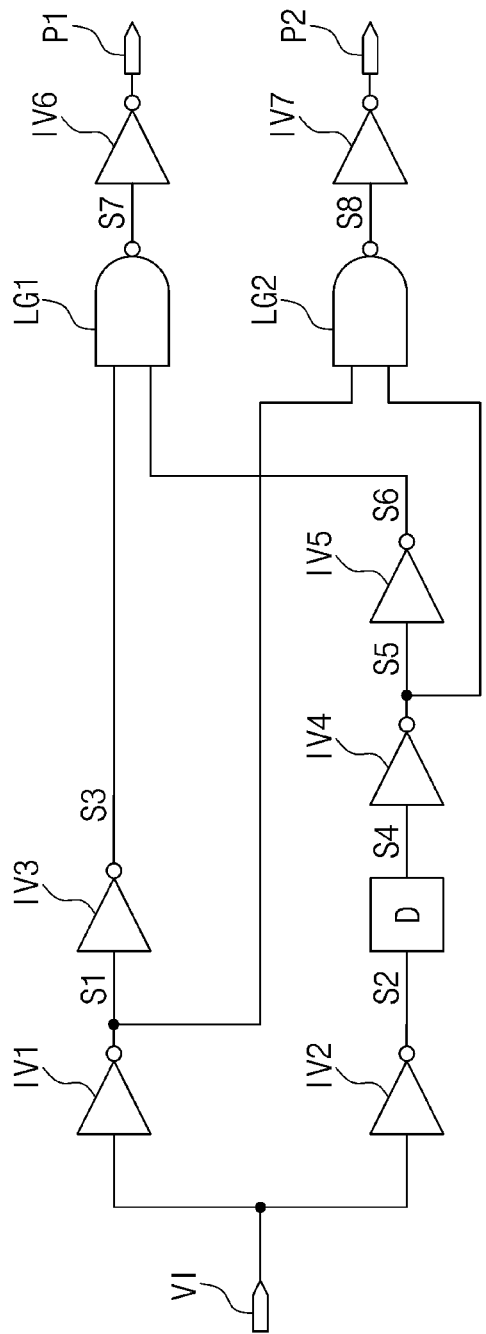
FIG. 5 illustrates an example of a pulse generator of the level shifter of FIG. 4.

FIG. 5 illustrates an example of pulse generator 250 of FIG. 4. Referring to FIGS. 4 and 5, pulse generator 250 includes first inverter IV1, second inverter IV2, third inverter IV3, fourth inverter IV4, fifth inverter IV5, sixth inverter IV6, seventh inverter IV7, delay unit "D", first logic gate LG1, and second logic gate LG2.

First inverter IV1 may receive the input voltage VI, invert the input voltage VI, and output first signal S1. Second inverter IV2 may receive the input voltage VI, invert the input voltage VI, and output second signal S2. Third inverter IV3 receives the first signal S1, inverts the first signal S1, and outputs third signal S3.

Delay unit "D" delays second signal S2 and outputs fourth signal S4. A delay amount of delay unit "D" determines the time period in which the first pulse signal P1 or the second pulse signal P2 temporarily have the active level. Fourth inverter IV4 inverts the fourth signal S4 and outputs a fifth signal S5. Fifth inverter IV5 inverts the fifth signal S5 and outputs a sixth signal S6.

First logic gate LG1 performs a NAND operation on the third signal S3 and the sixth signal S6 and outputs a seventh signal S7 as a result of the operation. Sixth inverter IV6 inverts the seventh signal S7 and outputs the first pulse signal P1. Second logic gate LG2 performs a NAND operation on the first signal S1 and the fifth signal S5 and outputs an eighth signal S8 as a result of the operation. Seventh inverter IV7 inverts the eighth signal S8 and outputs the second pulse signal P2.

Figure 6:
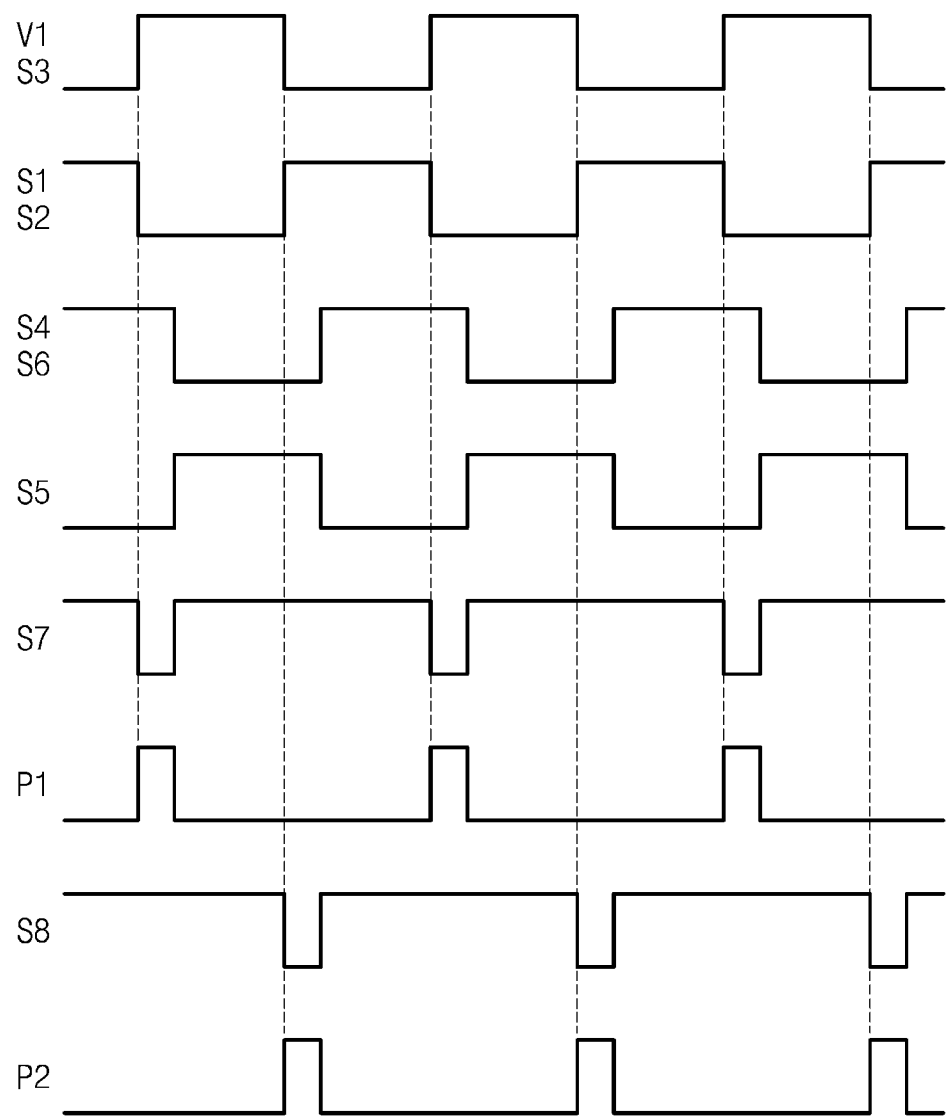
FIG. 6 illustrates an example of pulse signals of the level shifter of FIG. 4.

FIG. 6 illustrates an example in which pulse generator 250 of FIG. 5 generates the first pulse signal P1 and second pulse signal P2. In FIG. 6, the horizontal axis represents time, and the vertical axis represents voltage levels of signals. Referring to FIGS. 4, 5, and 6, the input voltage VI may swing between the high level and the low level. The third signal S3 has the same waveform as the input voltage VI.

The first signal S1 and the second signal S2 have waveforms complementary to the waveform of the input voltage VI. The fourth signal S4 and the sixth signal S6 have waveforms that are delayed with respect to the waveform of the second signal S2 by the delay unit "D". The fifth signal S5 has a waveform complementary to the waveform of the fourth signal S4.

The seventh signal S7 has a low level only when both the third signal S3 and the sixth signal S6 are at a high level. The first pulse signal P1 has a waveform complementary to the waveform of the seventh signal S7. That is, the first pulse signal P1 may be activated temporarily (e.g., as much as a delay amount of the delay unit "D") in synchronization with a rising edge of the input voltage VI (e.g., a low-to-high transition of the input voltage VI).

The eighth signal S8 has a low level only when both the first signal S1 and the fifth signal S5 are at a high level. The second pulse signal P2 has a waveform complementary to the waveform of the eighth signal S8. That is, the second pulse signal P2 may be activated temporarily (e.g., as much as a delay amount of the delay unit "D") in synchronization with a falling edge of the input voltage VI (e.g., a high-to-low transition of the input voltage VI).

When the first pulse signal P1 is activated in response to the rising edge of the input voltage VI, first transistor T1 connects the third node N3 and the first ground node to which the first ground voltage VSS1 is supplied. Accordingly, sixth shifting transistor 226 is quickly turned on in response to the rising edge of the input voltage VI and starts to supply a current to the second node N2. Accordingly, the timing when a voltage of the second node N2 transitions to the high level may be advanced.

Likewise, when the second pulse signal P2 is activated in response to the falling edge of the input voltage VI, second transistor T2 connects the fourth node N4 and the first ground node. Accordingly, fifth shifting transistor 225 is quickly turned on in response to the falling edge of the input voltage VI and starts to supply a current to the first node N1. Accordingly, the timing when a voltage of the first node N1 transitions to the high level may be advanced.

Level shifter 200 according to an embodiment of the inventive concepts may generate a pulse signal at the timing when the input voltage VI transitions and may quickly update voltage levels latched by shifting latch 227 of shifting block 220 by using the pulse signal. Accordingly, operating speed of level shifter 200 may be improved, and reliability of level shifter 200 may be improved.

Figure 7:
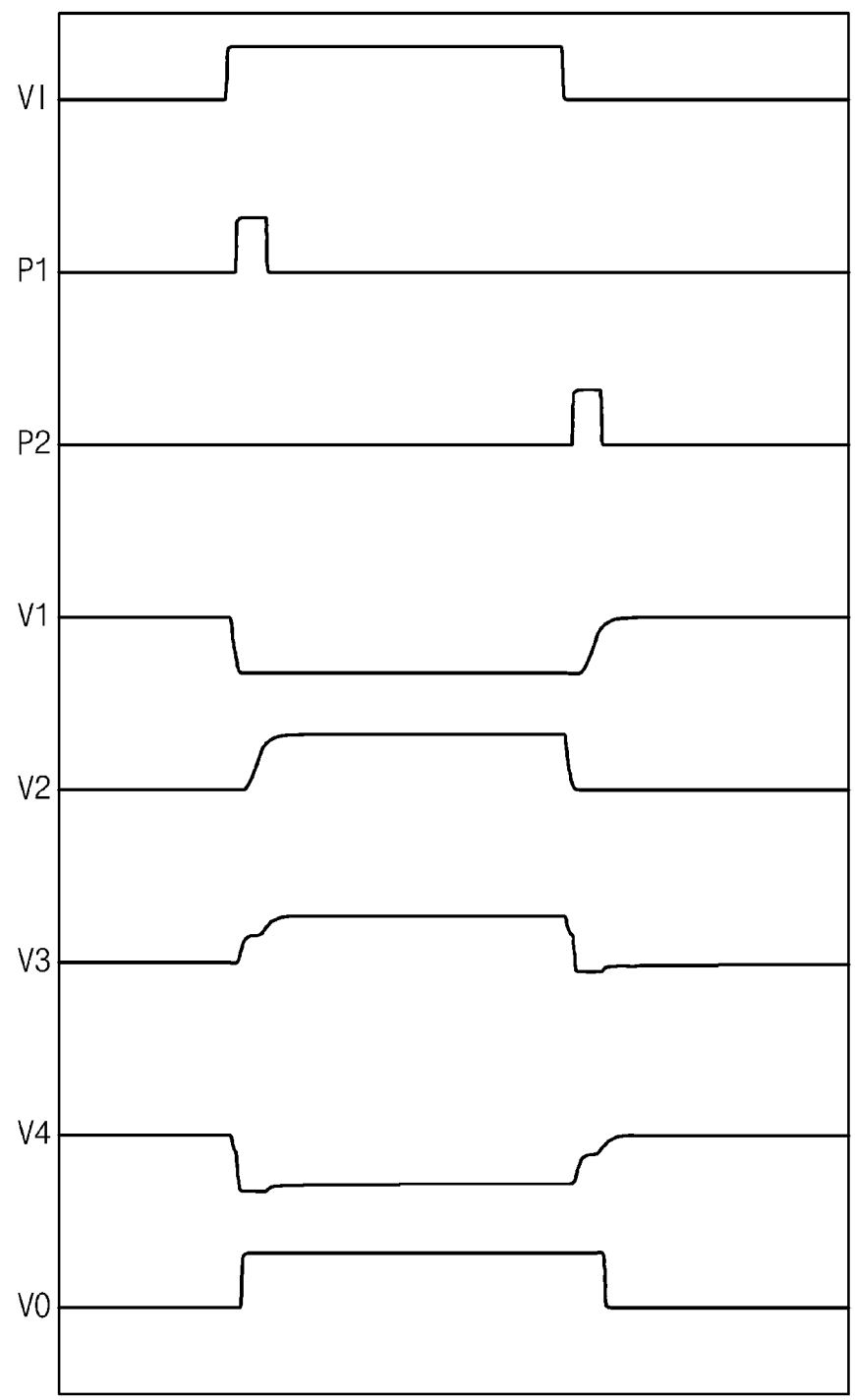
FIG. 7 illustrates an example in which voltages of the level shifter of FIG. 4 change.

FIG. 7 illustrates an example in which voltages of level shifter 200 of FIG. 4 change. In FIG. 7, the horizontal axis represents time, and the vertical axis represents voltage levels of signals. FIG. 7 shows a simulation result when a difference between the second power supply voltage VDD2 and the second ground voltage VSS2 is 4.5 V, and when the first power supply voltage VDD1 is 4.8 V.

Referring to FIGS. 4 and 7, the input voltage VI, the first pulse signal P1, the second pulse signal P2, the first voltage V1 of the first node N1, the second voltage V2 of the second node N2, the third voltage V3 of the third node N3, the fourth voltage V4 of the fourth node N4, and the output voltage VO are illustrated.

When the input voltage VI transitions from the low level to the high level, the first pulse signal P1 is temporarily activated and then deactivated. As the first pulse signal P1 is activated, compared to the example illustrated in FIG. 2, the second voltage V2 may transition from the low level to the high level at higher speed. Also, the speed at which the third voltage V3 and the fourth voltage V4 transition may be higher than in the example illustrated in FIG. 2.

When the input voltage VI transitions from the high level to the low level, the second pulse signal P2 is temporarily activated and then deactivated. As the second pulse signal P2 is activated, compared to the example illustrated in FIG. 2, the first voltage V1 may transition from the low level to the high level at higher speed. Also, the speed at which the third voltage V3 and the fourth voltage V4 transition may be higher than in the example illustrated in FIG. 2.

Figure 8:
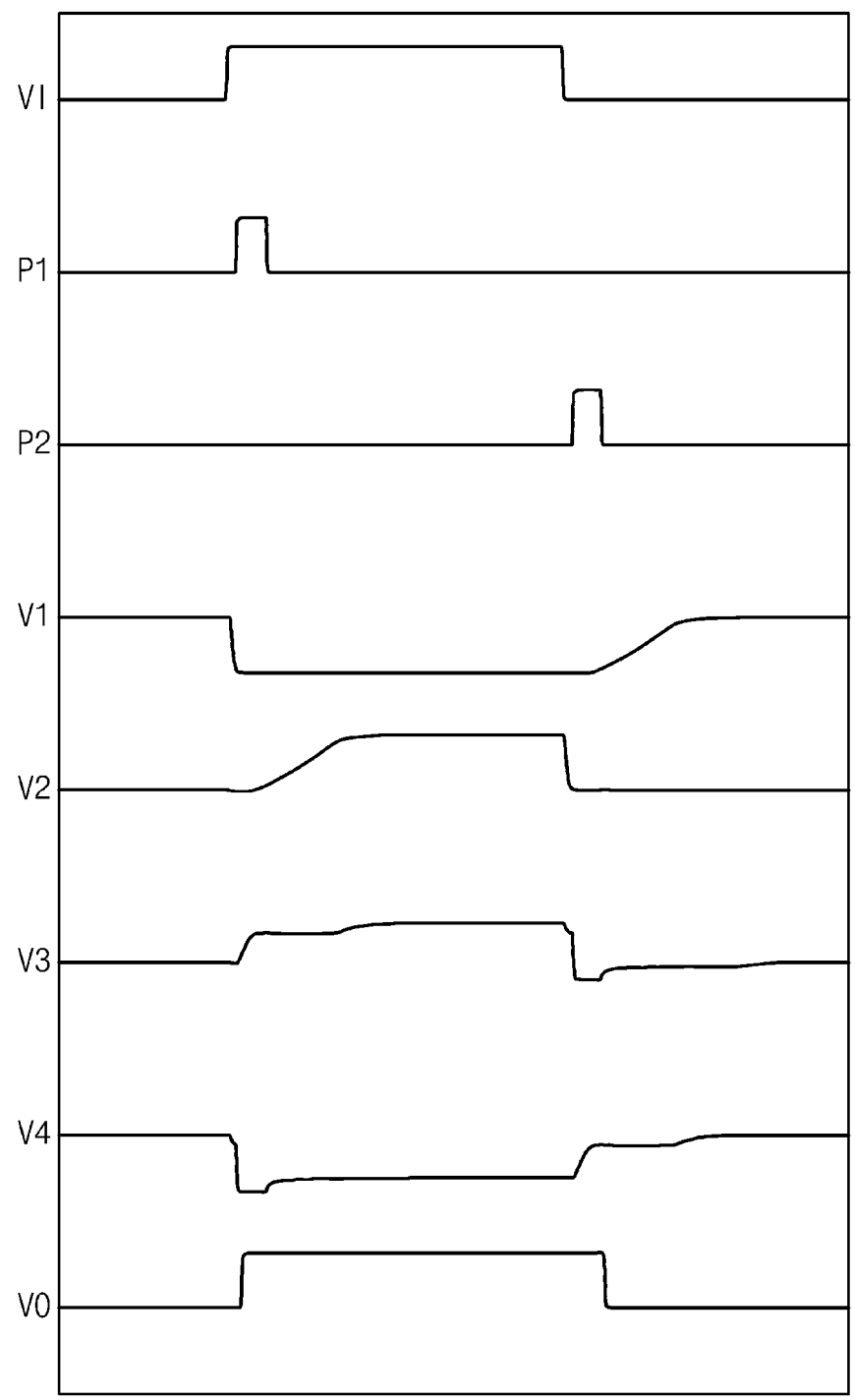
FIG. 8 illustrates another example in which voltages of the level shifter of FIG. 4 change.

FIG. 8 illustrates another example in which voltages of level shifter 200 of FIG. 4 change. FIG. 8 shows a simulation result when a difference between the second power supply voltage VDD2 and the second ground voltage VSS2 is 2 V, and when the first power supply voltage VDD1 is 2 V.

Referring to FIGS. 4 and 8, the input voltage VI, the first pulse signal P1, the second pulse signal P2, the first voltage V1 of the first node N1, the second voltage V2 of the second node N2, the third voltage V3 of the third node N3, the fourth voltage V4 of the fourth node N4, and the output voltage VO are illustrated.

Referring to FIGS. 4 and 8, when the input voltage VI transitions from the low level to the high level, compared to the example illustrated in FIG. 3, the second voltage V2 transitions to the high level. As the second voltage V2 successfully transitions to the high level, the third voltage V3 and the fourth voltage V4 also successfully transition, and level shifter 200 operates normally.

Figure 9:
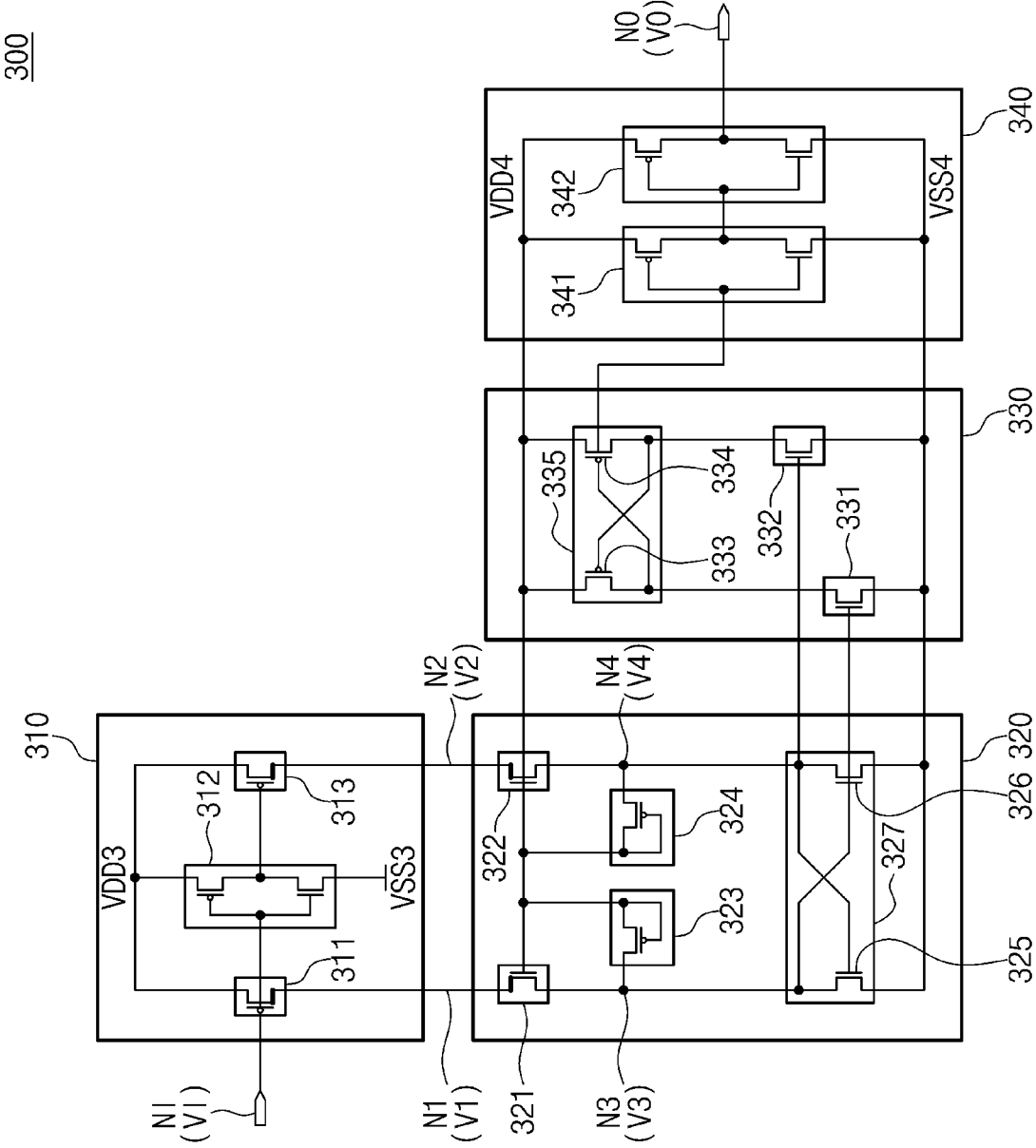
FIG. 9 illustrates a level shifter according to an embodiment of the inventive concepts.

FIG. 9 illustrates level shifter 300 according to another embodiment of the inventive concepts. Referring to FIG. 9, level shifter 300 includes input block 310, shifting block 320, signal transfer block 330, and output block 340. Level shifter 300 may convert the input voltage VI based on a voltage domain of (or defined by) a third power supply voltage VDD3 and a third ground voltage VSS3 into the output voltage VO based on a voltage domain of (or defined by) a fourth power supply voltage VDD4 and a fourth ground voltage VSS4. The fourth power supply voltage VDD4 may be a lower voltage than the third power supply voltage VDD3, and the fourth ground voltage VSS4 may be a lower voltage than the third ground voltage VSS3.

The input block 310 includes first input transistor 311 that receives the input voltage VI, input inverter 312 that receives the input voltage VI and inverts the input voltage VI and outputs a corresponding voltage, and second input transistor 313 that receives an output of input inverter 312. That is, second input transistor 313 receives an inversion signal of the input voltage VI (i.e., an inverted version of the input voltage VI).

First input transistor 311 is connected between the first node N1 and a third power node to which the third power supply voltage VDD3 is supplied. A voltage of the first node N1 may be the first voltage V1. Second input transistor 313 is connected between the second node N2 and the third power node. A voltage of the second node N2 may be the second voltage V2. Input inverter 312 is connected between a third ground node to which the third ground voltage VSS3 is supplied and the third power node.

When the input voltage VI is at the low level (e.g., is the third ground voltage VSS3), first input transistor 311 supplies a current from the third power node to the first node N1. When the input voltage VI is at the high level (e.g., is the third power supply voltage VDD3), second input transistor 313 supplies a current from the third power node to the second node N2.

Shifting block 320 is connected with the first node N1 and the second node N2. When a current is supplied through the first node N1 and a current is supplied through the second node N2 (e.g., alternately), shifting block 320 generates a voltage that swings between the fourth power supply voltage VDD4 and the fourth ground voltage VSS4 in synchronization with swing timings of the input voltage VI.

Shifting block 320 includes first shifting transistor 321 that operates in response to the fourth power supply voltage VDD4 and that is connected between the first node N1 and the third node N3, and second shifting transistor 322 that operates in response to the fourth power supply voltage VDD4 and that is connected between the second node N2 and the fourth node N4.

Shifting block 320 furthers includes third shifting transistor 323 that is connected between a fourth power node to which the fourth power supply voltage VDD4 is supplied and the third node N3 and that has a gate connected with the fourth power node, and fourth shifting transistor 324 that is connected between the fourth power node and the fourth node N4 and that has a gate connected with the fourth power node.

Shifting block 320 further includes shifting latch 327. Shifting latch 327 includes fifth shifting transistor 325 that is connected between a fourth ground node to which the fourth ground voltage VSS4 is supplied and the third node N3 and that has a gate connected with the fourth node N4, and sixth shifting transistor 326 that is connected between the fourth ground node and the fourth node N4 and that has a gate connected with the third node N3.

Each of third shifting transistor 323 and fourth shifting transistor 324 may operate as a diode. Third shifting transistor 323 may apply the fourth power supply voltage VDD4, for example a voltage obtained by subtracting a threshold voltage of third shifting transistor 323 from the fourth power supply voltage VDD4, to the third node N3.

Third shifting transistor 323 may thus control the third voltage V3 of the third node N3 such that the third voltage V3 is not higher than the fourth power supply voltage VDD4, for example the voltage obtained by subtracting a threshold voltage of third shifting transistor 323 from the fourth power supply voltage VDD4. Likewise, fourth shifting transistor 324 may control the fourth voltage V4 of the fourth node N4 such that the fourth voltage V4 is not higher than the fourth power supply voltage VDD4 (e.g., the voltage obtained by subtracting a threshold voltage of fourth shifting transistor 324 from the fourth power supply voltage VDD4).

First shifting transistor 321 may separate the voltage domain of shifting latch 327 from the voltage domain of input block 310 such that first input transistor 311 operates at voltages equal to or higher than the third ground voltage VSS3 and such that shifting latch 327 operates at the fourth power supply voltage VDD4, for example a voltage equal to or lower than the voltage obtained by subtracting the threshold voltage of third shifting transistor 323 from the fourth power supply voltage VDD4. Likewise, second shifting transistor 322 may separate the voltage domain of input block 310 from the voltage domain of shifting latch 327.

To endure the high-voltage stress, first shifting transistor 321 and first input transistor 311 may be implemented with high-voltage transistors. For example, first shifting transistor 321 may be a lateral diffusion NMOS (LDNMOS) transistor, and first input transistor 311 may be a lateral diffusion PMOS (LDPMOS) transistor. Likewise, second shifting transistor 322 may be an LDNMOS transistor, and second input transistor 313 may be an LDPMOS transistor.

When the input voltage VI is at the high level (e.g., is the third power supply voltage VDD3), second input transistor 313 supplies a current to the second node N2. When second input transistor 313 supplies a current to the second node N2, the fourth voltage V4 of the fourth node N4 may increase (e.g., to the high level of the fourth power supply voltage VDD4). As the fourth voltage V4 of the fourth node N4 increases, fifth shifting transistor 325 of shifting latch 327 may be turned on.

As fifth shifting transistor 325 is turned on, the third voltage V3 of the third node N3 may decrease (e.g., to the low level of the fourth ground voltage VSS4). As the third voltage V3 decreases, sixth shifting transistor 326 of shifting latch 327 may be turned off. That is, when the input voltage VI is at the high level (e.g., is the third power supply voltage VDD3), the third node N3 may store the low level (e.g., the fourth ground voltage VSS4), and the fourth node N4 may store the high level (e.g., the fourth power supply voltage VDD4).

When the input voltage VI is at the low level (e.g., is the third ground voltage VSS3), first input transistor 311 supplies a current to the first node N1. When the first input transistor 311 supplies a current to the first node N1, the third voltage V3 of the third node N3 may increase (e.g., to the high level of the fourth power supply voltage VDD4). As the third voltage V3 of the third node N3 increases, sixth shifting transistor 326 of shifting latch 327 may be turned on.

As the sixth shifting transistor 326 is turned on, the fourth voltage V4 of the fourth node N4 may decrease (e.g., to the low level of the fourth ground voltage VSS4). As the fourth voltage V4 decreases, fifth shifting transistor 325 of the shifting latch 327 may be turned off. That is, when the input voltage VI is at the low level (e.g., is the third ground voltage VSS3), the third node N3 may store the high level (e.g., the fourth power supply voltage VDD4), and the fourth node N4 may store the low level (e.g., the fourth ground voltage VSS4).

That is, when the input voltage VI swings between the high level of the third power supply voltage VDD3 and the low level of the third ground voltage VSS3, the third voltage V3 of the third node N3 may swing between the low level of the fourth ground voltage VSS4 and the high level of the fourth power supply voltage VDD4, and the fourth voltage V4 of the fourth node N4 may swing between the high level of the fourth power supply voltage VDD4 and the low level of the fourth ground voltage VSS4.

Signal transfer block 330 includes first signal transfer transistor 331, second signal transfer transistor 332, and signal transfer latch 335. First signal transfer transistor 331 is connected between the fourth ground node and a first end of signal transfer latch 335 and operates in response to the third voltage V3 of the third node N3. Second signal transfer transistor 332 is connected between the fourth ground node and a second end of signal transfer latch 335 and operates in response to the fourth voltage V4 of the fourth node N4.

Signal transfer latch 335 includes third signal transfer transistor 333 that is connected between the first end of signal transfer latch 335 and the fourth power node and that has a gate connected with the second end of signal transfer latch 335, and fourth signal transfer transistor 334 that is connected between the second end of signal transfer latch 335 and the fourth power node and that has a gate connected with the first end of signal transfer latch 335.

First signal transfer transistor 331 may drain a current from the first end of signal transfer latch 335 in response to the third voltage V3 of the third node N3. Second signal transfer transistor 332 may drain a current from the second end of signal transfer latch 335 in response to the fourth voltage V4 of the fourth node N4. A voltage at the first end of signal transfer latch 335 may follow a change in the fourth voltage V4 of the fourth node N4, and a voltage at the second end of the signal transfer latch 335 may follow a change in the third voltage V3 of the third node N3.

Output block 340 includes first output inverter 341 and second output inverter 342 that are both connected between the fourth ground node and the fourth power node. First output inverter 341 has an input that is connected to the first end of signal transfer latch 335. Second output inverter 342 has an input that is connected to an output of first output inverter 341. An output of second output inverter 342 may be connected with the output node NO and may be output as the output voltage VO.

In an embodiment, signal transfer block 330 may be omitted. In the case where signal transfer block 330 is omitted, output block 340 may be modified to receive the fourth voltage V4 of the fourth node N4 at the input of the first output inverter 341. In another embodiment, for example at least one inverter may be added between signal transfer block 330 and shifting block 320. In other embodiments, output block 340 may be modified to include one inverter. In still further embodiments, output block 340 may include at least one inverter in addition to first output inverter 341 and second output inverter 342.

A next stage (e.g., signal transfer block 330 and output block 340 of FIG. 9) of shifting block 320 may receive the third voltage V3 of the third node N3 or the fourth voltage V4 of the fourth node N4 as an input. The next stage of shifting block 320 may be configured to output the output voltage VO following a voltage change of the input voltage VI.

As described with reference to FIG. 9, level shifter 300 may use an LDPMOS transistor or an LDNMOS transistor for the purpose of enduring the high-voltage stress. However, the use of the LDPMOS transistor or the LDNMOS transistor may cause a decrease in operating speed of level shifter 300 and reduction of reliability.

Figure 10:
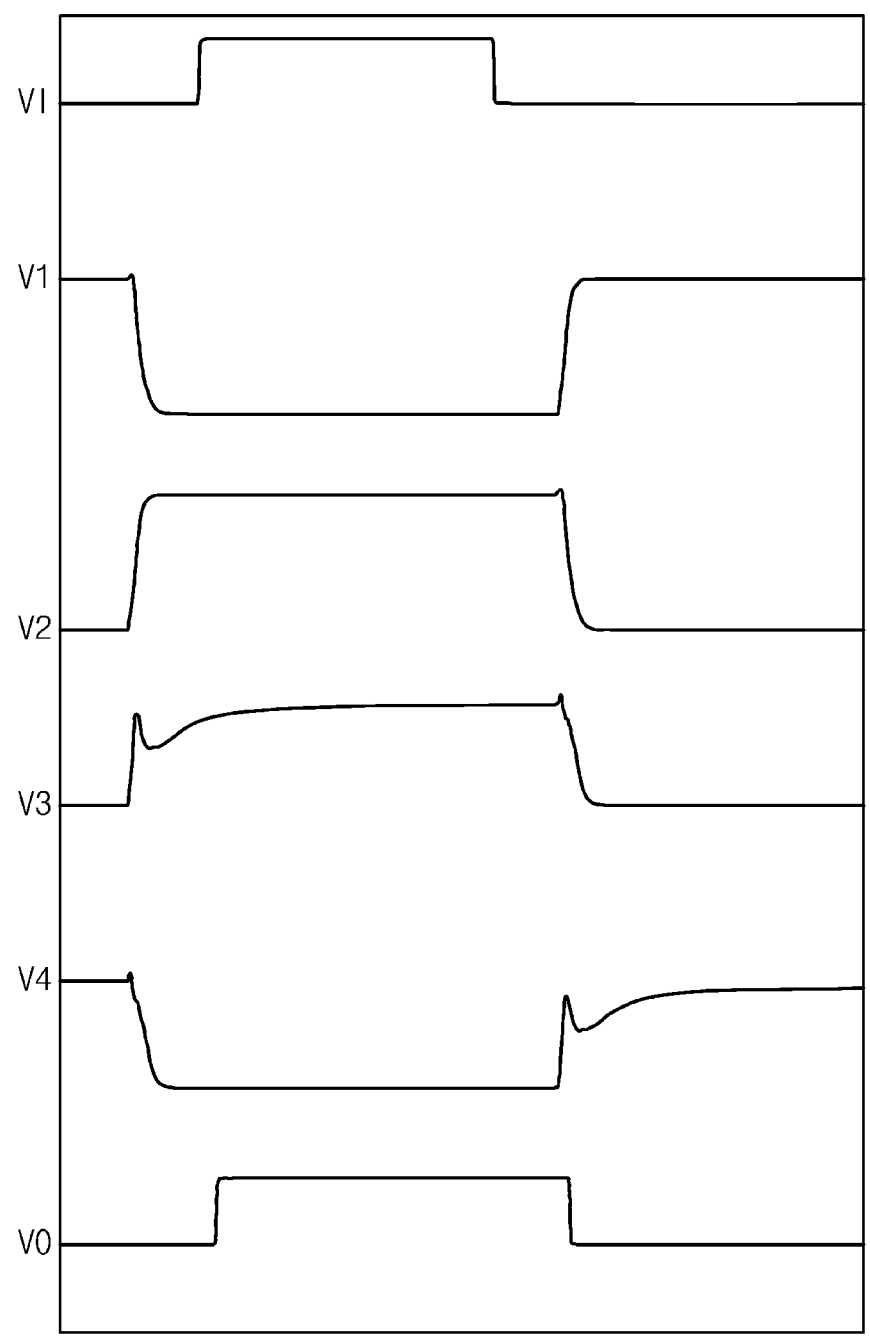
FIG. 10 illustrates an example in which voltages of the level shifter of FIG. 9 changes.

FIG. 10 illustrates an example in which voltages of the level shifter 300 of FIG. 9 change. In FIG. 10, the horizontal axis represents time, and the vertical axis represents voltage levels of signals. FIG. 10 shows a simulation result when a difference between the third power supply voltage VDD3 and the third ground voltage VSS3 is 4.5 V, and when the fourth power supply voltage VDD4 is 4.8 V.

Referring to FIGS. 9 and 10, the input voltage VI, the first voltage V1 of the first node N1, the second voltage V2 of the second node N2, the third voltage V3 of the third node N3, the fourth voltage V4 of the fourth node N4, and the output voltage VO are illustrated.

As illustrated in FIG. 10, when the input voltage VI transitions from the low level to the high level, the third voltage V3 transitions from the low level to the high level relatively slowly. Likewise, when the input voltage VI transitions from the high level to the low level, the fourth voltage V4 transitions from the low level to the high level relatively slowly.

Figure 11:
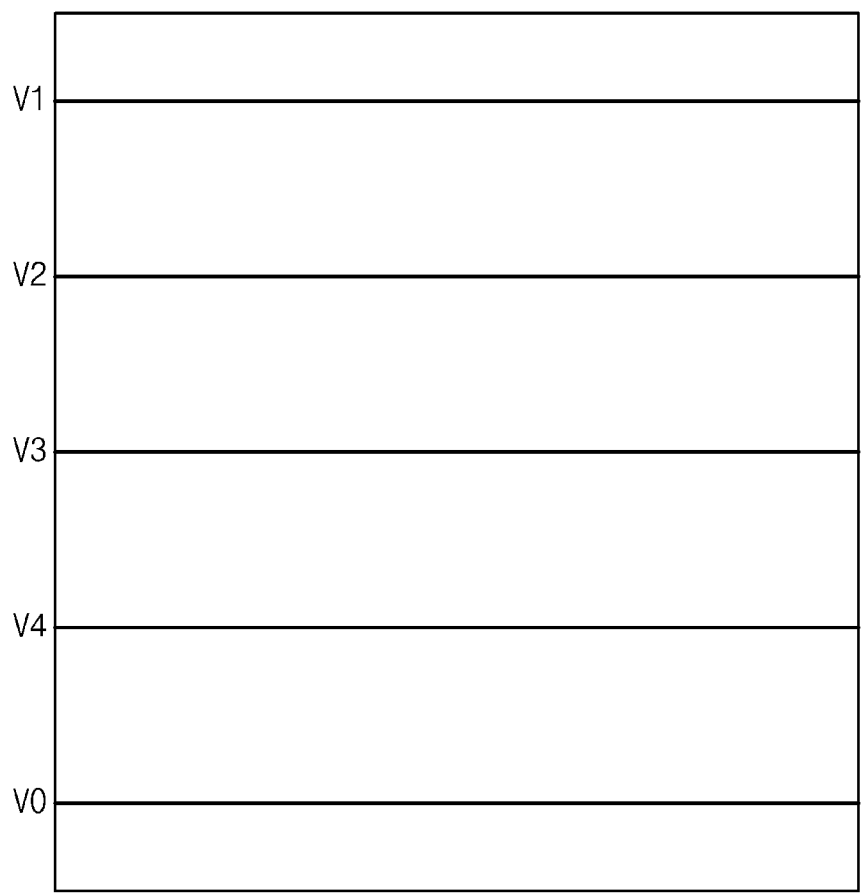
FIG. 11 illustrates another example in which voltages of the level shifter of FIG. 9 changes.

FIG. 11 illustrates another example in which voltages of the level shifter 300 of FIG. 9 change. FIG. 11 shows a simulation result when a difference between the third power supply voltage VDD3 and the third ground voltage VSS3 is 2 V, and when the fourth power supply voltage VDD4 is 2 V.

Referring to FIGS. 9 and 11, the first voltage V1 of the first node N1, the second voltage V2 of the second node N2, the third voltage V3 of the third node N3, the fourth voltage V4 of the fourth node N4, and the output voltage VO are illustrated. The input voltage VI may be identical to the input voltage VI illustrated in FIG. 10.

Referring to FIGS. 9 and 11, even though the input voltage VI transitions from the low level to the high level or transitions from the high level to the low level, the first voltage V1, the second voltage V2, the third voltage V3, the fourth voltage V4, and the output voltage VO do not change. Accordingly, level shifter 300 may operate abnormally.

As described above, the capacitances of first shifting transistor 321 and second shifting transistor 322 may delay an operation of level shifter 300 or may cause an abnormal operation of level shifter 300.

Figure 12:
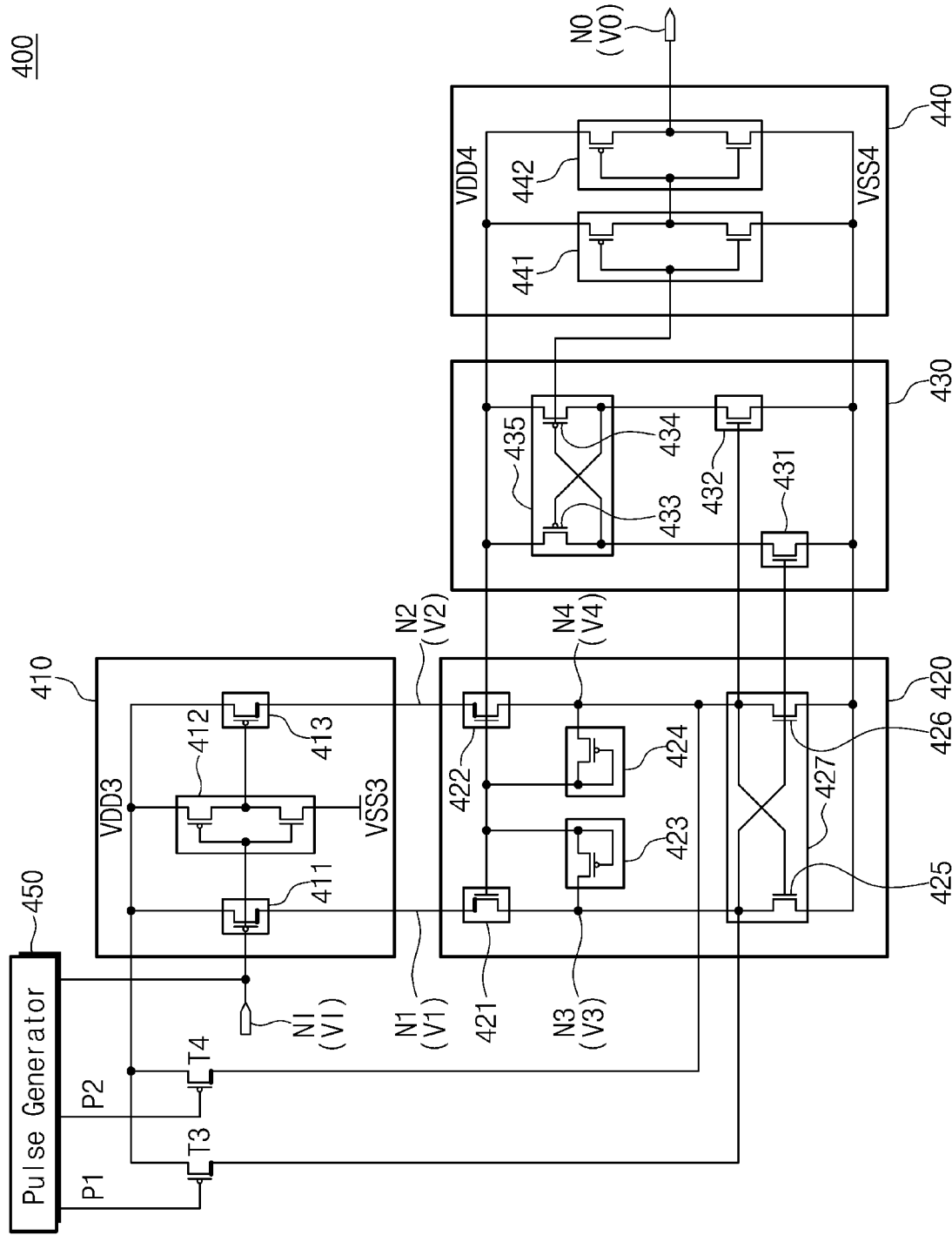
FIG. 12 illustrates a level shifter according to an embodiment of the inventive concepts.

FIG. 12 illustrates a level shifter 400 according to another embodiment of the inventive concepts. Referring to FIG. 12, level shifter 400 may include an input block 410, shifting block 420, signal transfer block 430, and output block 440. Level shifter 400 may convert the input voltage VI based on the voltage domain of the third power supply voltage VDD3 and the third ground voltage VSS3 into the output voltage VO based on the voltage domain of the fourth power supply voltage VDD4 and the fourth ground voltage VSS4.

Input block 410 includes first input transistor 411, input inverter 412, and second input transistor 413. The structure and operation of input block 410 are identical to the structure and operation of input block 310 of FIG. 9. Accordingly, description of input block 410 that is the same as the description of input block 310 is omitted to avoid redundancy.

Shifting block 420 includes first shifting transistor 421, second shifting transistor 422, third shifting transistor 423, fourth shifting transistor 424, and shifting latch 427. Shifting latch 427 includes fifth shifting transistor 425 and sixth shifting transistor 426.

The structure and operation of shifting block 420 are identical to the structure and operation of shifting block 320 of FIG. 9, except that shifting block 420 is connected to third transistor T3 and fourth transistor T4. The description of shifting block 420 that is the same as the description of shifting block 320 of FIG. 9 will be omitted from the following to avoid redundancy.

Signal transfer block 430 includes first signal transfer transistor 431, second signal transfer transistor 432, and signal transfer latch 435. Signal transfer latch 435 includes third signal transfer transistor 433 and fourth signal transfer transistor 434. The structure and operation of signal transfer block 430 are identical to the structure and operation of signal transfer block 330 of FIG. 9. Accordingly, description of signal transfer block 430 that is the same as the description of signal block 330 is omitted to avoid redundancy.

Output block 440 includes first output inverter 441 and second output inverter 442. The structure and operation of output block 440 are identical to the structure and operation of the output block 340 of FIG. 9. Accordingly, description of output block 440 that is the same as the description of output block 340 is omitted to avoid redundancy.

Compared with level shifter 300 of FIG. 9, level shifter 400 further includes third transistor T3, fourth transistor T4, and pulse generator 450. Each of third transistor T3 and fourth transistor T4 may be an LDPMOS transistor. Third transistor T3 is connected between the third node N3 and the third power node to which the third power supply voltage VDD3 is supplied. Third transistor T3 may directly connect the third node N3 and the third power node temporarily in response to a first pulse signal P1 transferred from pulse generator 450.

Fourth transistor T4 is connected between the fourth node N4 and the third power node. Fourth transistor T4 may directly connect the fourth node N4 and the third power node temporarily in response to a second pulse signal P2 transferred from pulse generator 450. Each of the first pulse signal P1 and the second pulse signal P2 may be a one-shot pulse that temporarily has an active level (e.g., the high level or the low level) and then has an inactive level (e.g., the low level or the high level).

Pulse generator 450 receives the input voltage VI from the input node NI. Pulse generator 450 generates the first pulse signal P1 and the second pulse signal P2 in response to the input voltage VI.

Figure 13:
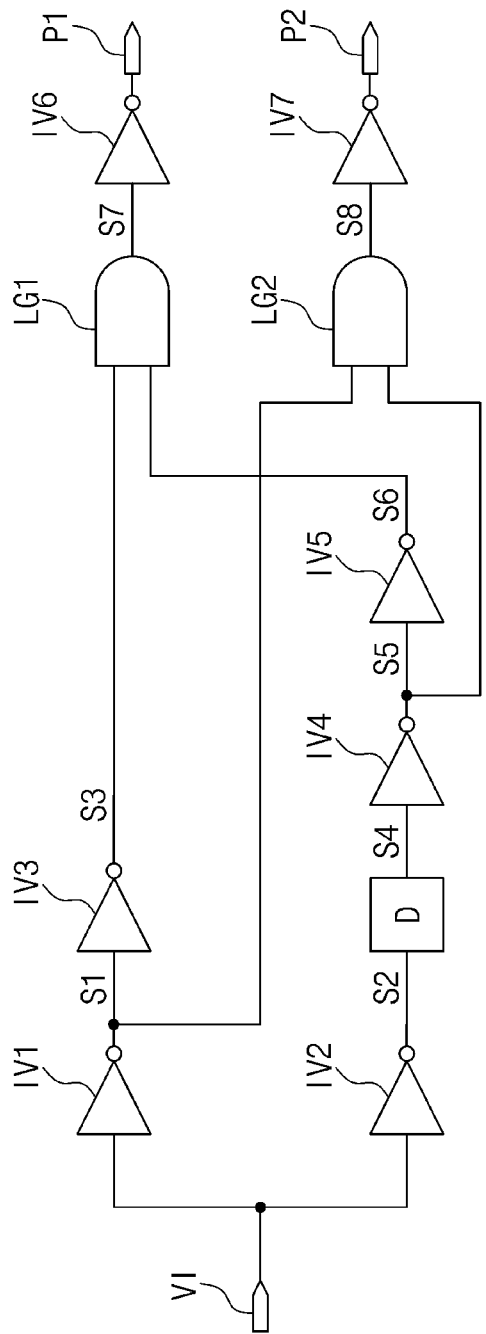
FIG. 13 illustrates an example of a pulse generator of the level shifter of FIG. 12.

FIG. 13 illustrates an example of pulse generator 450 of FIG. 12. Referring to FIGS. 12 and 13, pulse generator 450 includes first inverter IV1, second inverter IV2, third inverter IV3, fourth inverter IV4, fifth inverter IV5, sixth inverter IV6, seventh inverter IV7, delay unit "D", first logic gate LG1, and second logic gate LG2.

The structure and operation of pulse generator 450 are identical to the structure and operation of pulse generator 250 of FIG. 4, except that first logic gate LG1 performs an AND operation and second logic gate LG2 performs an AND operation. Accordingly description of pulse generator 450 that is the same as the description of pulse generator 250 will be omitted to avoid redundancy.

Figure 14:
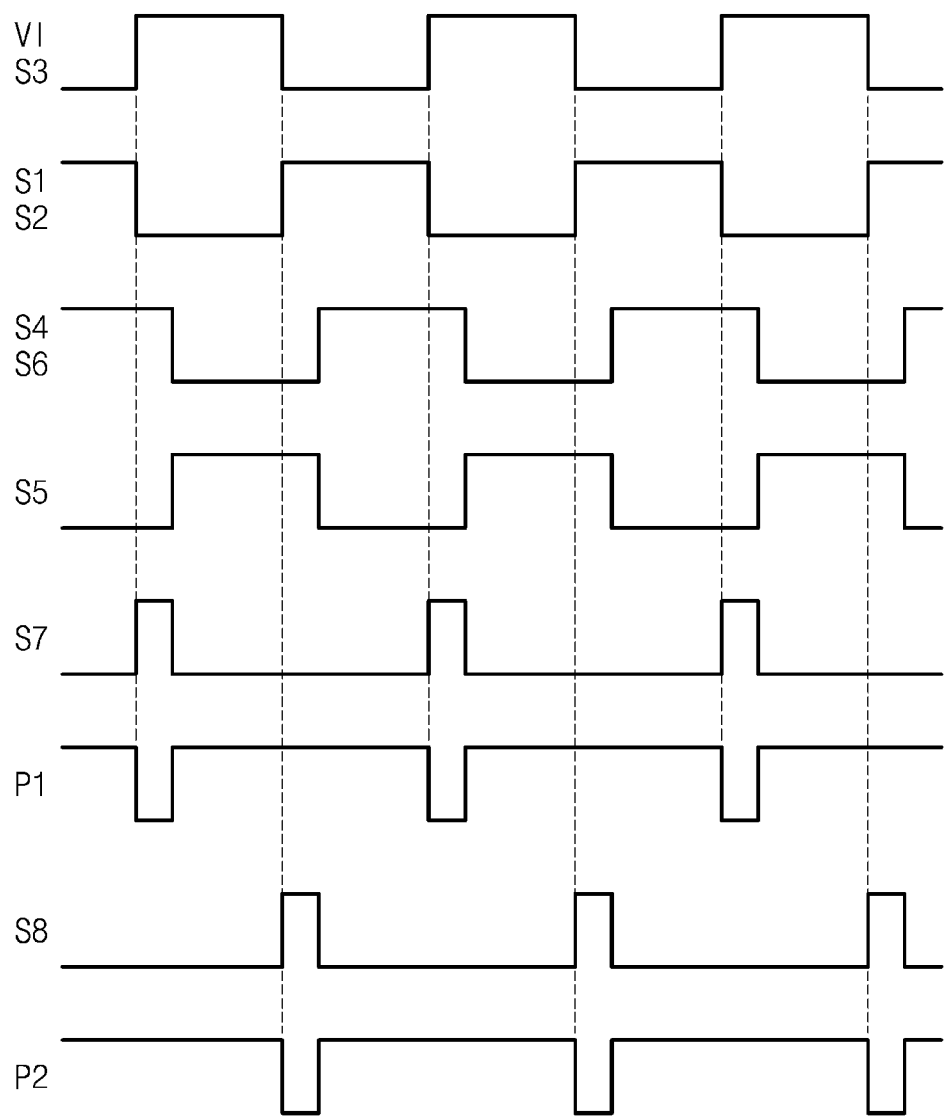
FIG. 14 illustrates an example of pulse signals of the level shifter of FIG. 12.

FIG. 14 illustrates an example in which the pulse generator 250 of FIG. 13 generates the first pulse signal P1 and the second pulse signal P2. In FIG. 14, the horizontal axis represents time, and the vertical axis represents voltage levels of signals. As described with reference to FIG. 13, first logic gate LG1 and second logic gate LG2 each perform an AND logic operation instead of a NOT operation, in contrast to first logic gate LG1 and second logic gate LG2 of FIG. 5.

Accordingly, the seventh signal S7 and the eighth signal S8 of FIG. 14 have waveforms corresponding to inverted versions of the seventh signal S7 and the eighth signal S8 of FIG. 6. Likewise, the first pulse signal P1 and the second pulse signal P2 of FIG. 14 have waveforms corresponding to inverted versions of the first pulse signal P1 and the second pulse signal P2 of FIG. 6.

Figure 15:
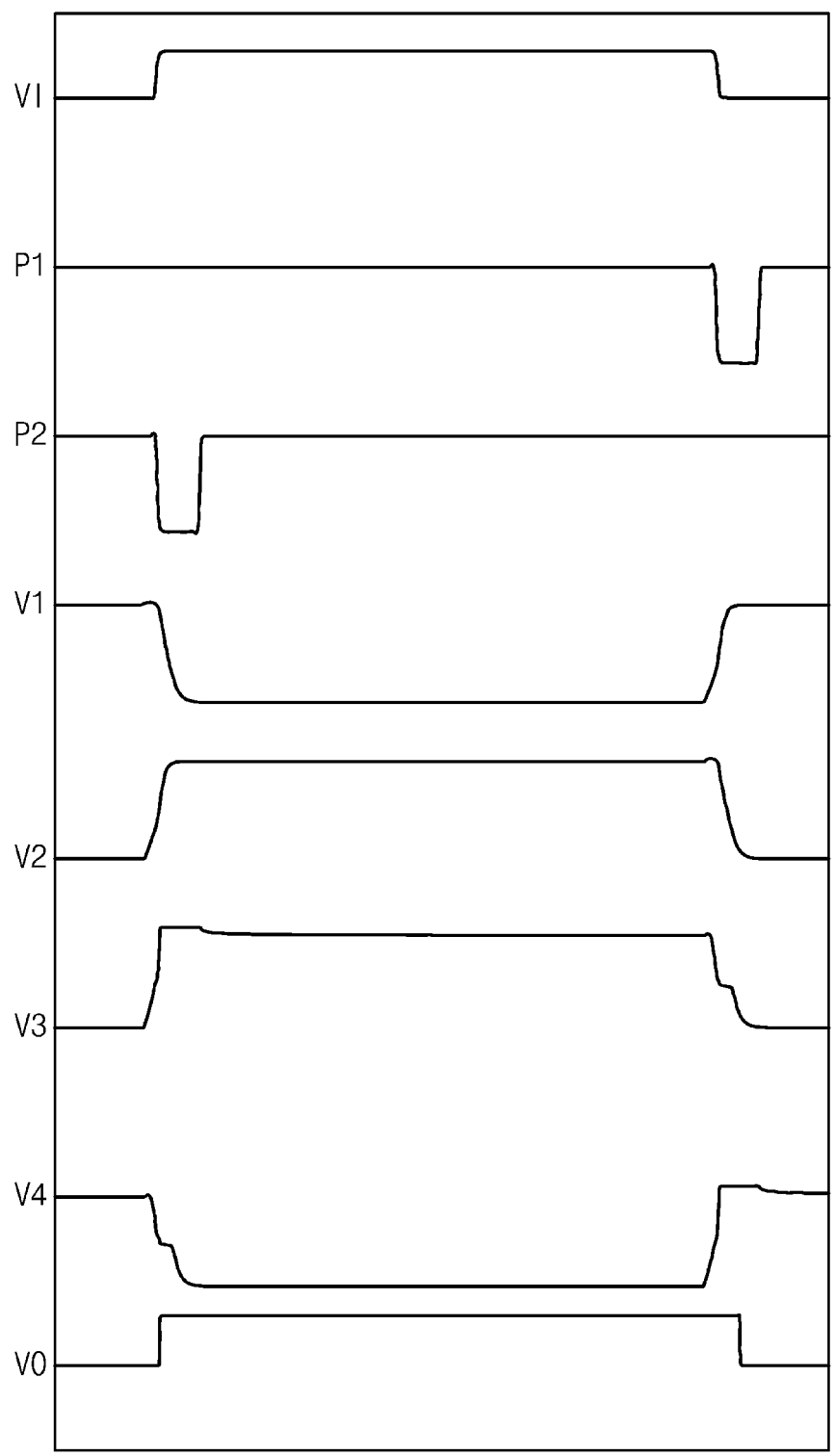
FIG. 15 illustrates an example in which voltages of the level shifter of FIG. 12 change.

FIG. 15 illustrates an example in which voltages of level shifter 400 of FIG. 12 change. In FIG. 15, the horizontal axis represents time, and the vertical axis represents voltage levels of signals. FIG. 15 shows a simulation result when a difference between the third power supply voltage VDD3 and the third ground voltage VSS3 is 4.5 V and the fourth power supply voltage VDD4 is 4.8 V.

Referring to FIGS. 12 and 15, the input voltage VI, the first pulse signal P1, the second pulse signal P2, the first voltage V1 of the first node N1, the second voltage V2 of the second node N2, the third voltage V3 of the third node N3, the fourth voltage V4 of the fourth node N4, and the output voltage VO are illustrated.

Compared to the waveforms of FIG. 10, when the input voltage VI transitions from the low level to the high level, a speed at which the third voltage V3 transitions to the high level is accelerated. Also, when the input voltage VI transitions from the high level to the low level, a speed at which the fourth voltage V4 transitions to the high level is accelerated.

Figure 16:
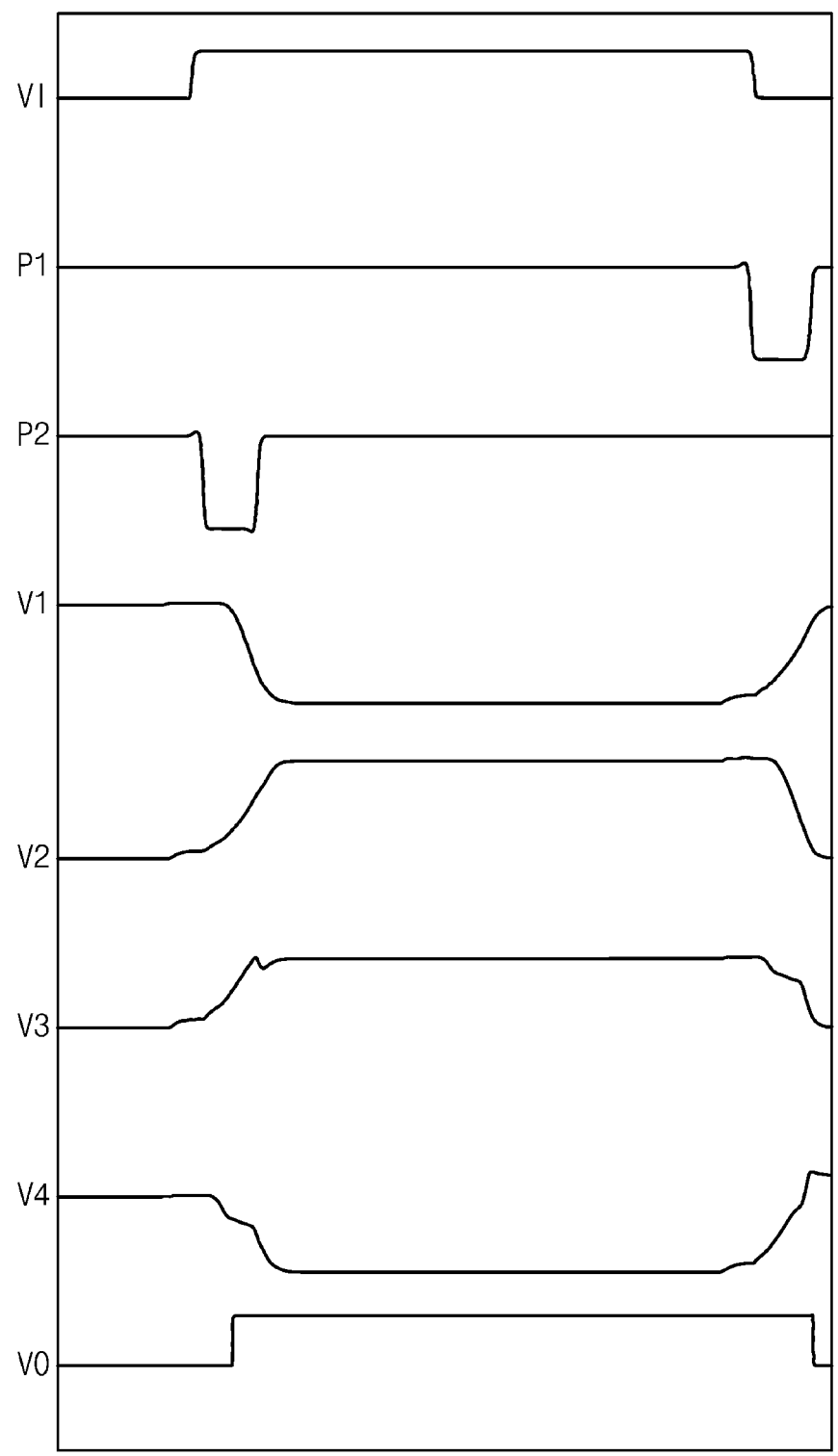
FIG. 16 illustrates another example in which voltages of the level shifter of FIG. 12 change.

FIG. 16 illustrates another example in which voltages of the level shifter 400 of FIG. 12 change. FIG. 16 shows a simulation result when a difference between the third power supply voltage VDD3 and the third ground voltage VSS3 is 2 V and the fourth power supply voltage VDD4 is 2 V.

Compared with the waveforms of FIG. 11, when the input voltage VI transitions from the low level to the high level and transitions from the high level to the low level, the first voltage V1, the second voltage V2, the third voltage V3, the fourth voltage V4, and the output voltage VO also successfully transition. Accordingly, level shifter 200 may operate normally.

Figure 17:
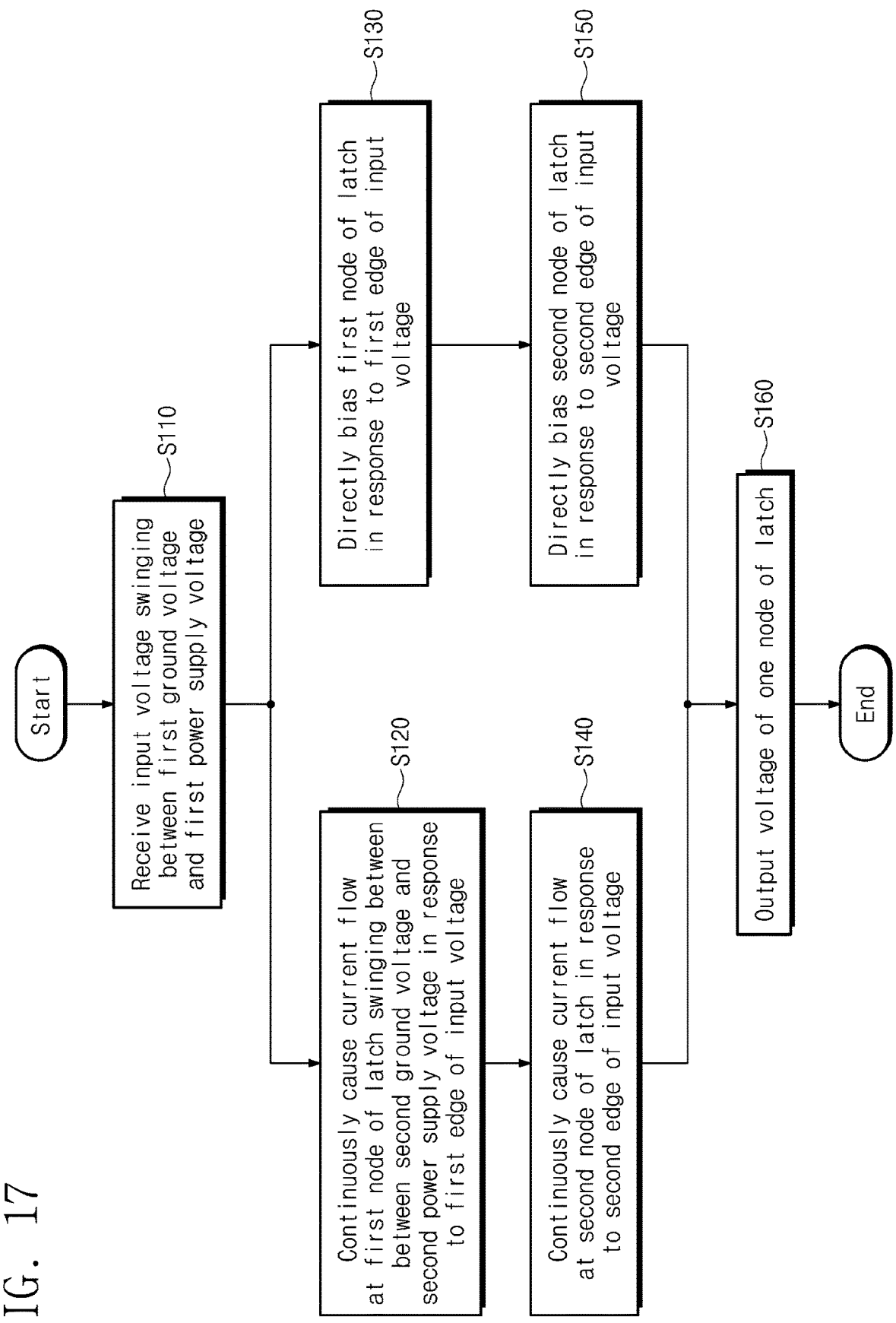
FIG. 17 illustrates an example of an operating method of a level shifter.

FIG. 17 illustrates an operating method of level shifter 200 of FIG. 4 or level shifter 400 of FIG. 12 according to an embodiment of the inventive concepts. Referring to FIG. 17, in operation S110, a level shifter (e.g., level shifter 200 or level shifter 400) receives an input voltage swinging between a first ground voltage and a first power supply voltage. For example, input block 210 of level shifter 200 in FIG. 4 may receive an input voltage swinging between the first ground voltage VSS1 and the first power supply voltage VDD1.

The level shifter performs operation S120 and operation S130 in parallel, for example during a first time period. In operation S120, the level shifter continuously causes current flow at a first node (e.g., node N3) of a latch (e.g., shifting latch 227 or shifting latch 427) swinging between a second ground voltage and a second power supply voltage in response to a first edge of the input voltage to thus store voltages at the first node. The continuous current flow at the first node may be caused by input block 210 or input block 410. In operation S130, the level shifter directly biases the first node of the latch (e.g., shifting latch 227 or shifting latch 427) in response to the first edge of the input voltage. The direct biasing may be performed by a pulse generator (e.g., pulse generator 250 or 450) that generates a pulse signal (e.g., first pulse signal P1).

The level shifter performs operation S140 and operation S150 in parallel, for example during a second time period. In operation S140, the level shifter continuously causes current flow at a second node (e.g., node N4) of the latch (e.g., shifting latch 227 or shifting latch 427) in response to a second edge of the input voltage to thus store voltages at the second node. The continuous current flow at the second node may be caused by input block 210 or input block 410. In operation S150, the level shifter directly biases the second node of the latch (e.g., shifting latch 227 or shifting latch 427) in response to the second edge of the input voltage. The direct biasing may be performed by a pulse generator (e.g., pulse generator 250 or 450) that generates a pulse signal (e.g., second pulse signal P2).

In operation S160, the level shifter outputs a voltage of one of the first and second nodes of the latch. The direct biasing in operation S130 and the direct biasing in operation S150 may allow voltage levels stored at the latch to be quickly updated. Accordingly, operating speed of the level shifter may be improved, and reliability of the level shifter may be improved.

Figure 18:
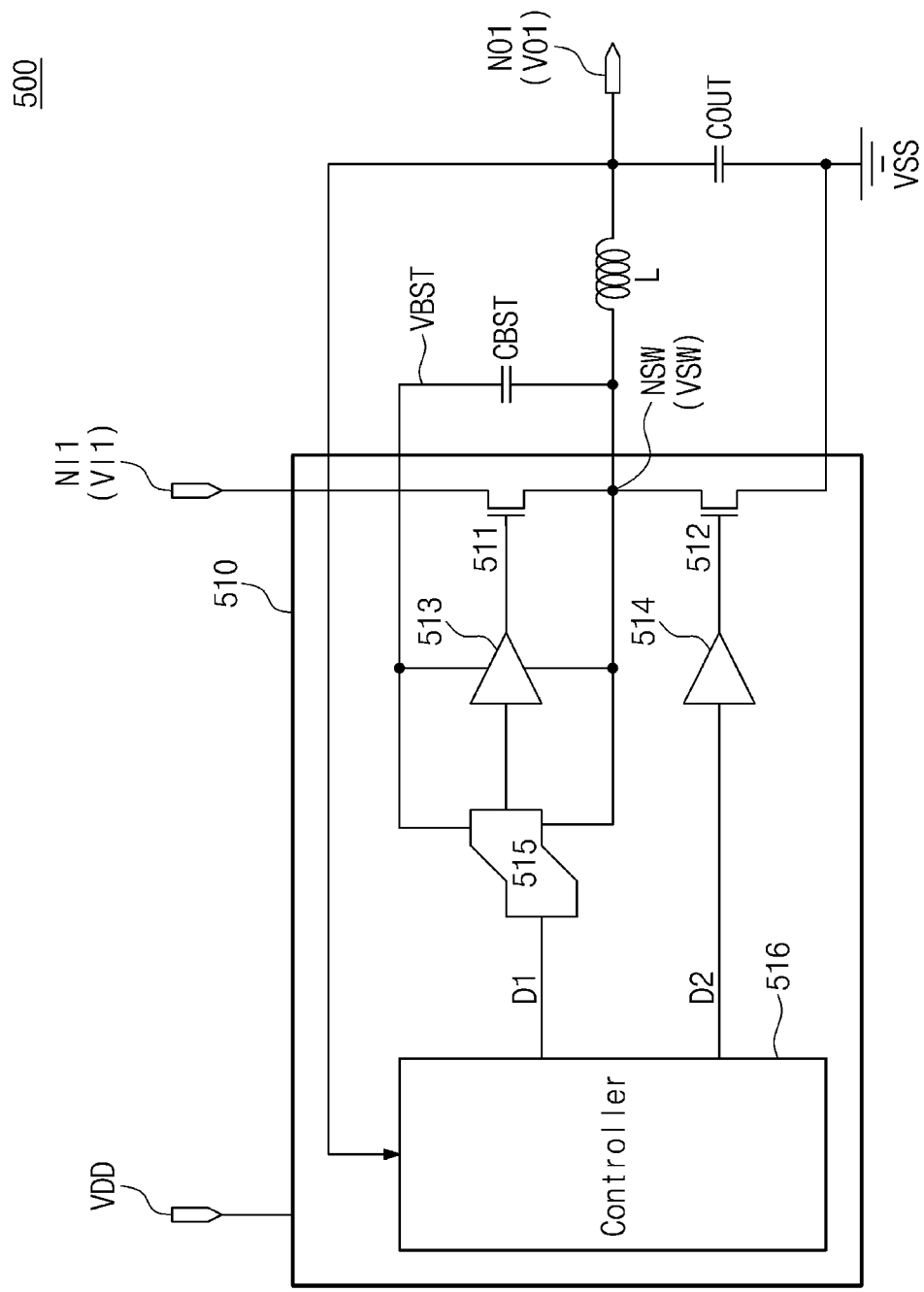
FIG. 18 illustrates a voltage controller including a level shifter of an embodiment of the inventive concepts.

FIG. 18 illustrates voltage converter 500 according to an embodiment of the inventive concepts. Referring to FIG. 18, voltage converter 500 may include integrated circuit 510. Integrated circuit 510 may include first transistor 511 and second transistor 512 connected between a first input node NI1 to which a first input voltage VI1 is input and a ground node to which a ground voltage VSS is applied.

Integrated circuit 510 may further include first driver 513 and second driver 514 driving first transistor 511 and second transistor 512, respectively. Second transistor 512 may be driven by a second driving signal D2 in a voltage domain of the ground voltage VSS and a power supply voltage VDD.

First transistor 511 may be driven in a voltage domain of a switch voltage VSW of the switch node NSW, and a boost voltage VBST formed by boost capacitor CBST. Accordingly, integrated circuit 510 may further include level shifter 515 that changes the voltage domain of a first driving signal D1 from controller 516 into the voltage domain of first transistor 511.

Integrated circuit 510 may further include controller 516 that adjusts duty ratios of the first driving signal D1 and the second driving signal D2 depending on a level of a first output voltage VO1 of a first output node NO1.

The switch node NSW may be connected with the first output node NO1 through an inductor "L". The first output node NO1 may be connected with an output capacitor COUT. The first output voltage VO1 of the first output node NO1 may be lower than the first input voltage VI.

Figure 19:
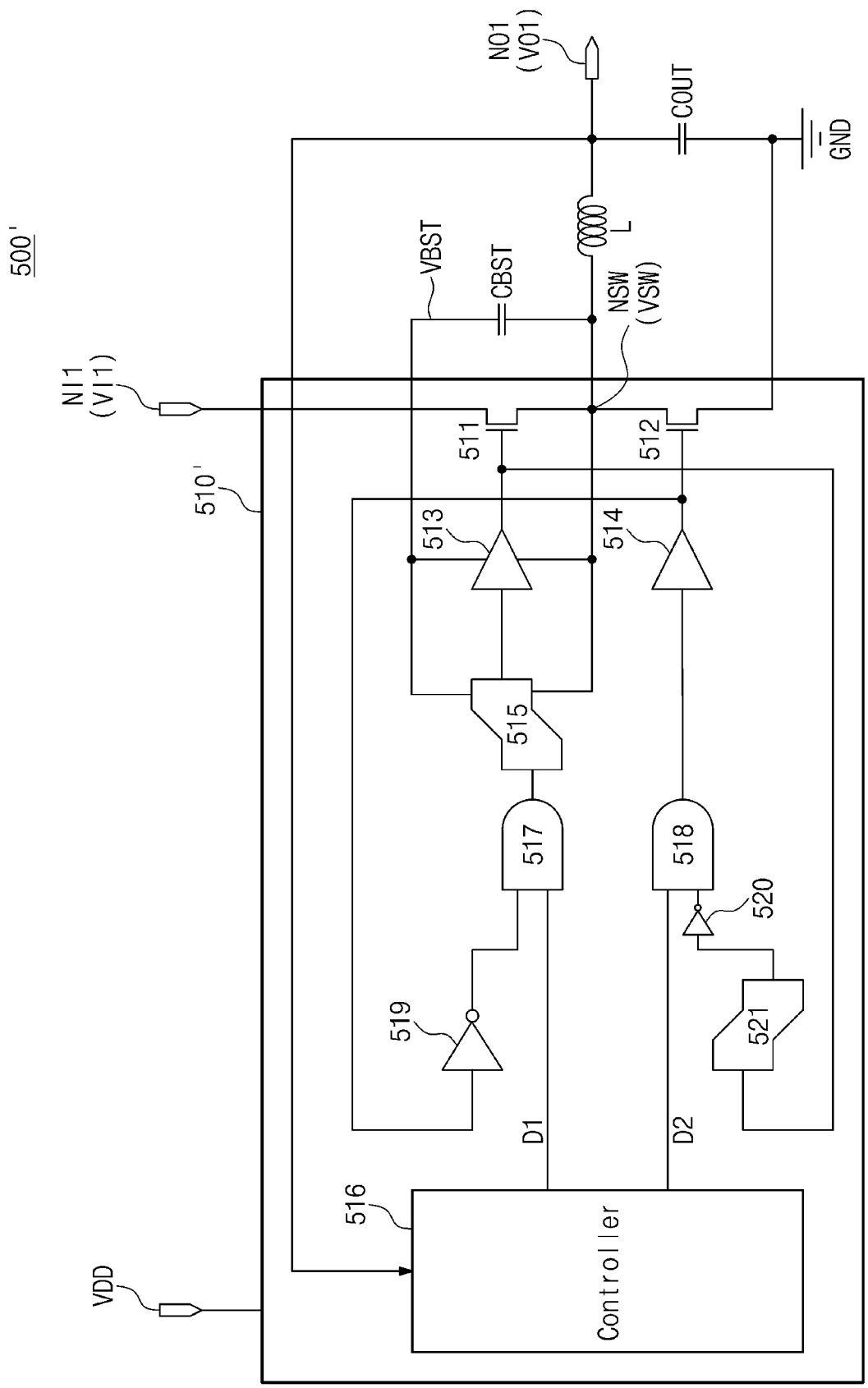
FIG. 19 illustrates a voltage controller including a level shifter of another embodiment of the inventive concepts.

FIG. 19 illustrates an expansion example 500' of voltage converter 500 of FIG. 18. Referring to FIG. 19, compared with voltage converter 500, integrated circuit 510' of voltage converter 500' may further include first AND gate 517, second AND gate 518, first inverter 519, second inverter 520, and second level shifter 521.

First inverter 519 and first AND gate 517 allow first transistor 511 to be turned on when second transistor 512 is turned off and the first driving signal D1 is at the high level. Second inverter 520 and second AND gate 518 allow second transistor 512 to be turned on when first transistor 511 is turned off and second driving signal D2 is at the high level.

Because an output of first driver 513 belongs to a domain of a switch voltage VS and the boost voltage VBST, integrated circuit 510' may further include second level shifter 521 that changes a relevant signal to the domain of the ground voltage VSS and the power supply voltage VDD.

Figure 20:
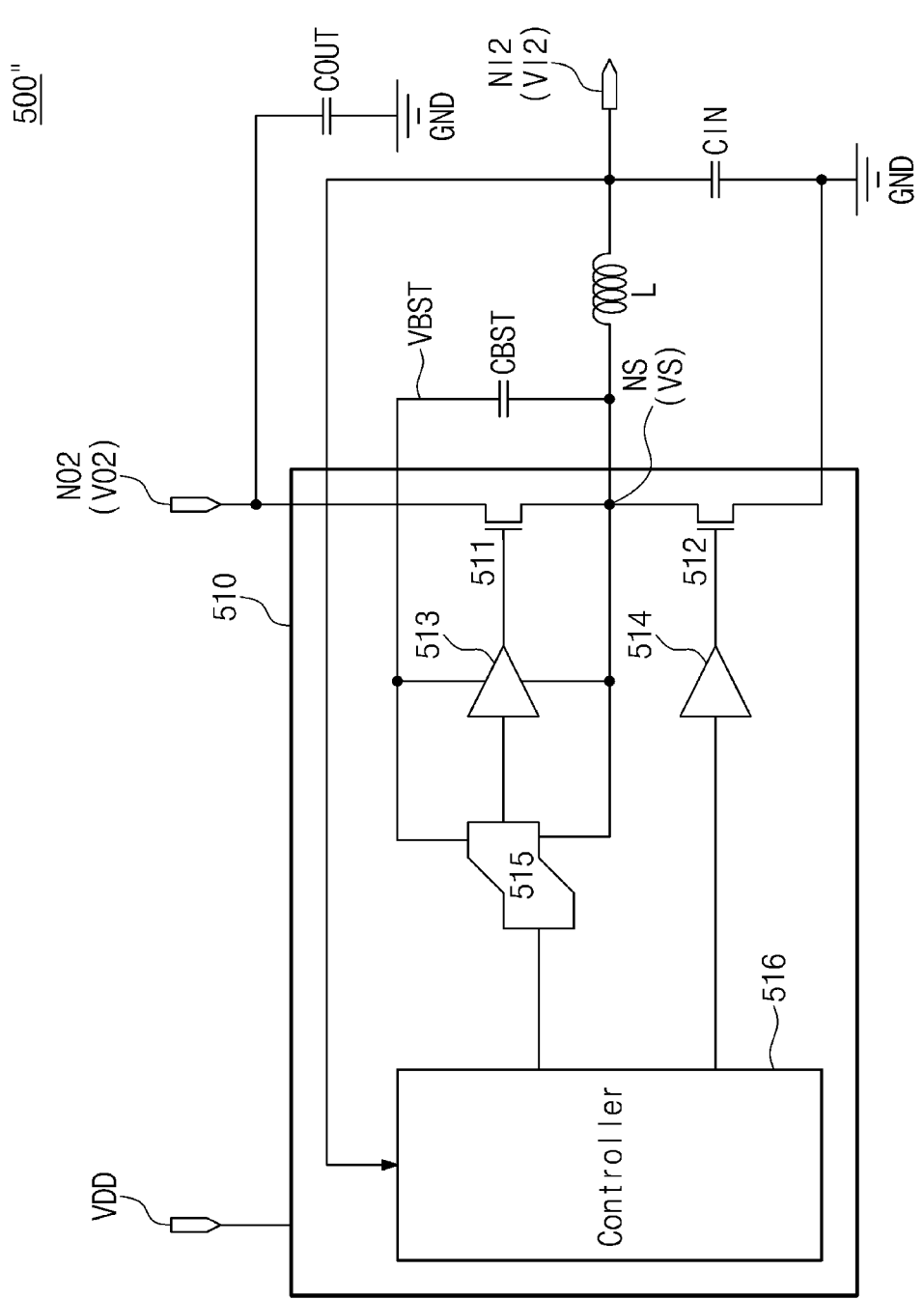
FIG. 20 illustrates a voltage controller including a level shifter of another embodiment of the inventive concepts.

FIG. 20 illustrates an additional expansion example 500" of voltage converter 500 of FIG. 18. Referring to FIG. 20, the first input node NI1 of voltage converter 500 of FIG. 18 may be used as a second output node NO2, and the first output node NO1 may be used as a second input node NI2. Input capacitor CIN may be connected with the second input node NI2, and output capacitor COUT may be connected with the second output node NO2. The second output voltage VO2 of the second output node NO2 may be lower than a second input voltage VI2 of the second input node NI2.

In a further embodiment, as described with reference to FIG. 19, the voltage converter 500" of FIG. 20 may additionally include AND gates such as AND gates 517 and 518, inverters such as inverters 519 and 420, and a level shifter such as level shifter 521 interconnected in a similar manner as shown in FIG. 19.

In the embodiments of FIGS. 18, 19 and 20, level shifters 515 and 521 may be configured such as shown in any of FIGS. 1, 4, 9 and 12.

Figure 21:
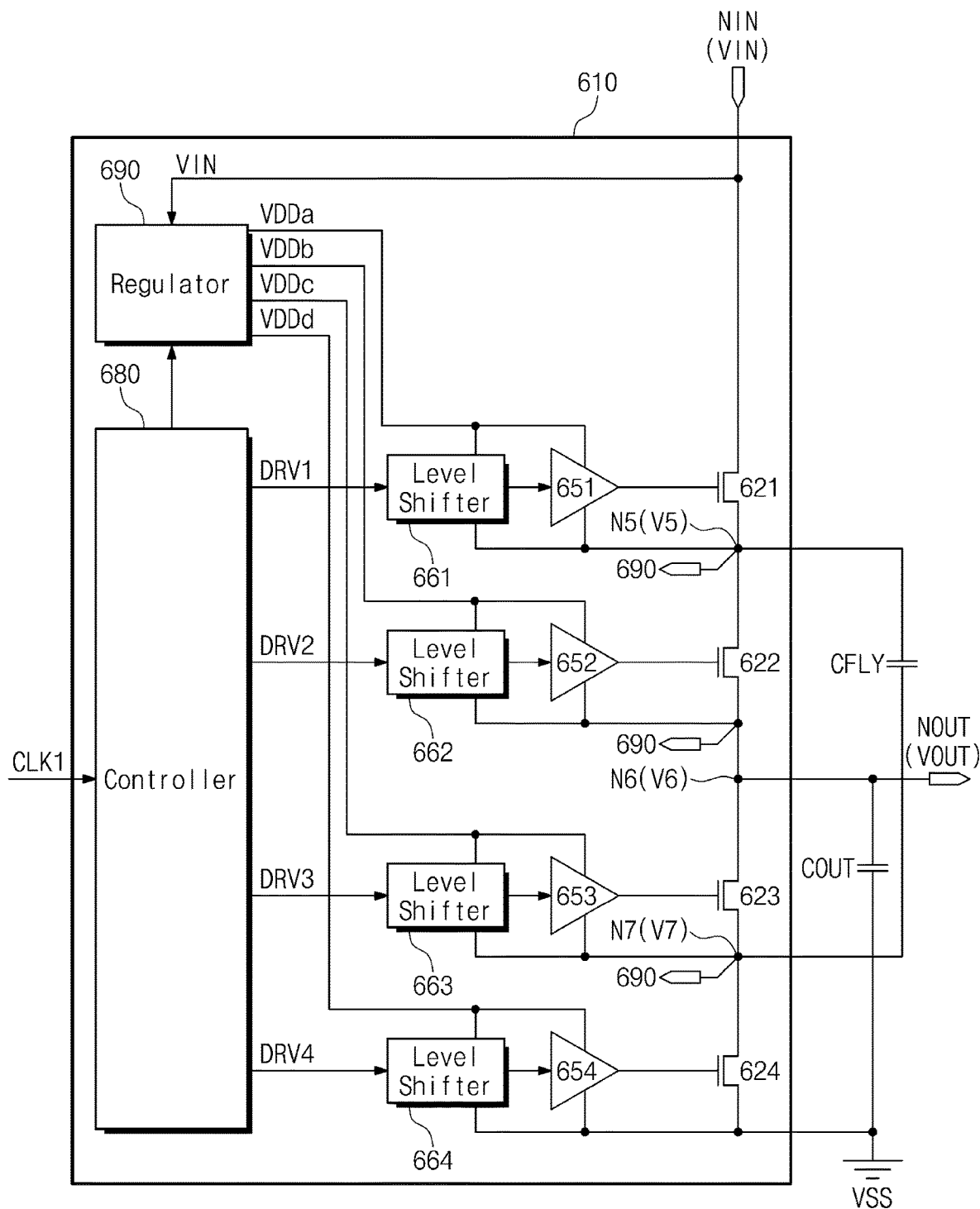
FIG. 21 illustrates a voltage controller including a level shifter of another embodiment of the inventive concepts.

FIG. 21 illustrates voltage converter 600 according to an embodiment of the inventive concepts. Referring to FIG. 21, voltage converter 600 may include integrated circuit 610. Integrated circuit 610 may include first to fourth transistors 621 to 624 connected between an input node NIN to which an input voltage VIN is input and a ground node to which ground voltage VSS is applied. Flying capacitor CFLY may be connected between a fifth node N5 and a seventh node N7. A sixth node N6 may be connected with an output node NOUT and may be connected with output capacitor COUT.

Integrated circuit 610 may further include first to fourth drivers 651 to 654 driving first to fourth transistors 621 to 624, respectively. First to fourth drivers 651 to 654 may belong to different voltage domains that are based on different power supply voltages VDDa, VDDb, VDDc, and VDDd. Accordingly, integrated circuit 610 may further include first to fourth level shifters 661 to 664 for converting voltage domains.

Integrated circuit 610 may further include controller 680 that outputs first to fourth driving signals DRV1 to DRV4 to first to fourth level shifters 661 to 664. In response to a first clock signal CLK1, controller 680 may control first transistor 621 and third transistor 623 to a first phase and may control second transistor 622 and fourth transistor 624 to a second phase complementary to the first phase.

Under control of controller 680, regulator 690 may generate the different power supply voltages VDDa, VDDb, VDDc, and VDDd based on the input voltage VIN, a fifth voltage V5, a sixth voltage V6, and a seventh voltage V7. Voltage converter 600 may be a capacitor divider. The output voltage VOUT may be lower than the input voltage VIN.

In an embodiment, as described with reference to FIG. 19, there may be added a feedback loop that includes an additional level shifter converting an output of a specific driver (e.g., one of 651 to 654) into a lower voltage domain, an inverter inverting an output of the additional level shifter, and an AND gate transferring a result of performing an AND operation on an output of the inverter and a relevant driving signal to a relevant level shifter (e.g., one of 661 to 664).

For example, an output of first driver 651 may be fed back to fourth level shifter 664, and an output of fourth driver 654 may fed back to first level shifter 661. An output of second driver 652 may be fed back to third level shifter 663, and an output of third driver 653 may fed back to second level shifter 662.

A signal that is input to each of first to fourth level shifters 661 to 664 may be an output of any other driver, which passes through a level shifter (corresponding to a lower voltage domain).

Figure 22:
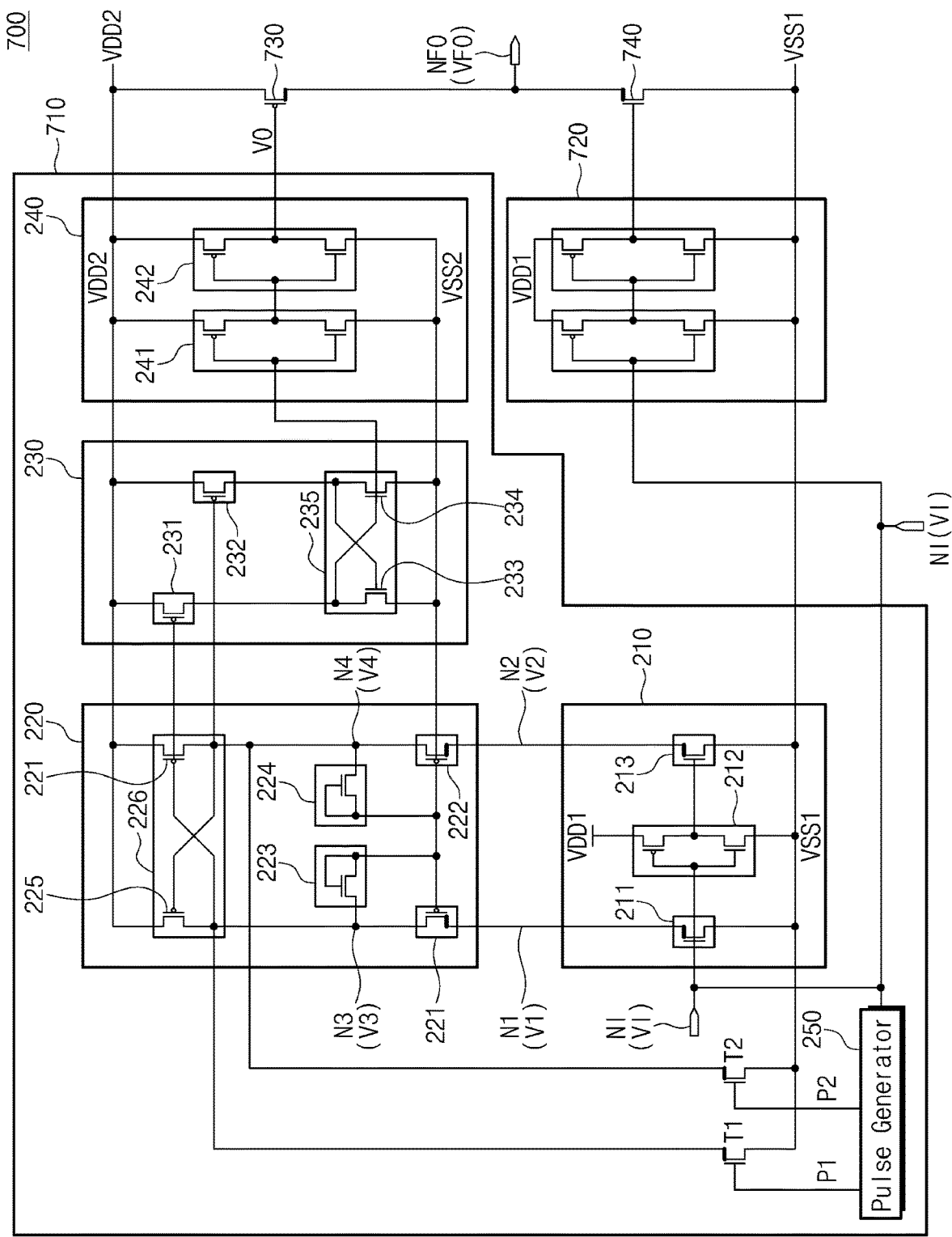
FIG. 22 illustrates a scan driver including a level shifter of an embodiment of the inventive concepts.

FIG. 22 illustrates scan driver 700 according to an embodiment of the inventive concepts. Referring to FIG. 22, scan driver 700 may include level shifter 710 and inverter block 720. Level shifter 710 may be level shifter 200 of FIG. 4. Inverter block 720 may include at least one or more inverters receiving the input voltage VI.

Level shifter 710 may drive first scan transistor 730 through the output voltage VO. Inverter block 720 may drive second scan transistor 740. First and second scan transistors 730 and 740 may output a final output signal VFO swinging between the second power supply voltage VDD2 and the first ground voltage VSS1 at a final output node NFO.

Figure 23:
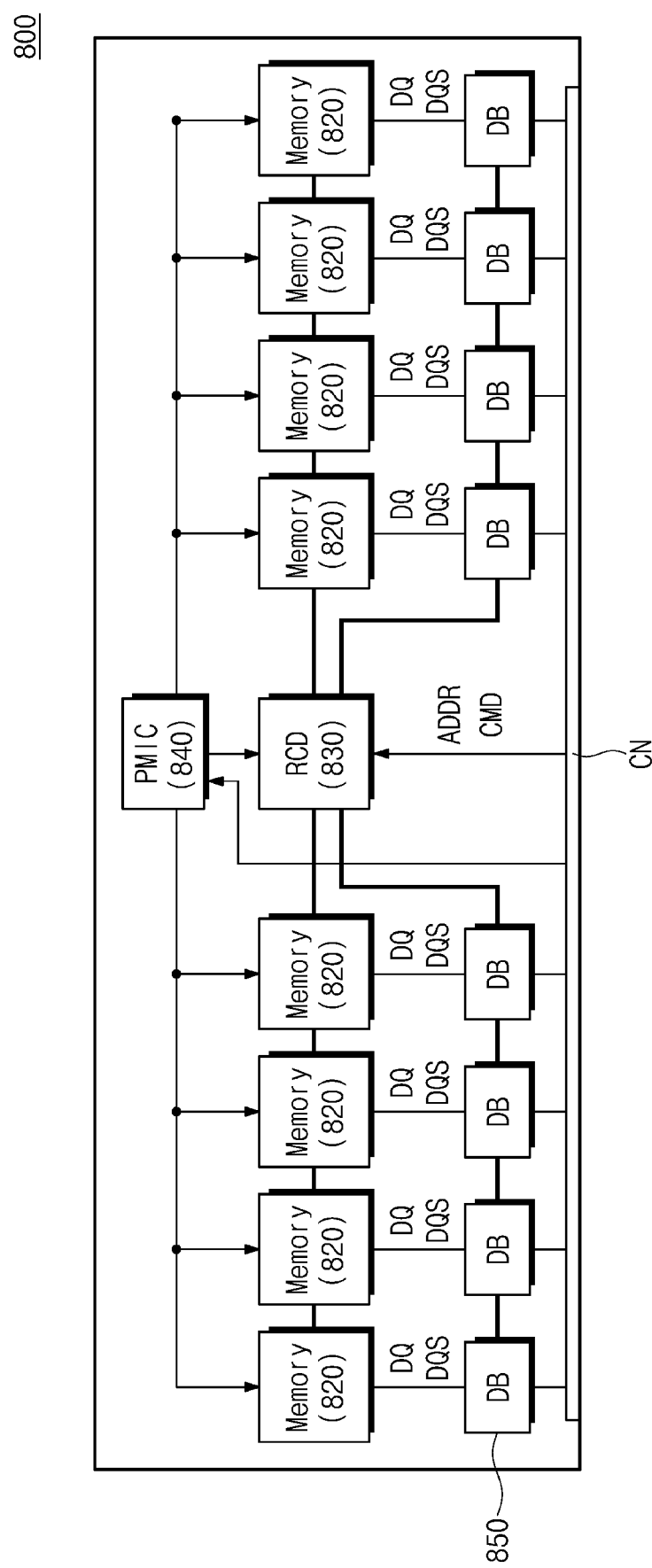
FIG. 23 illustrates a memory module of an embodiment of the inventive concepts.

FIG. 23 illustrates memory module 800 according to an embodiment of the inventive concepts. Memory module 800 may include memories 820, driver 830 (RCD), power management integrated circuit 840 (PMIC), buffers 850 (DB), and connector CN on a printed circuit board. Power management integrated circuit 840 may supply power to memories 820, driver 830, and buffers 850. Driver 830 may receive an address ADDR and a command CMD and may control memories 820 and buffers 850. Memories 820 may exchange data DQ and a data strobe signal DQS with an external device through buffers 850.

Figure 24:
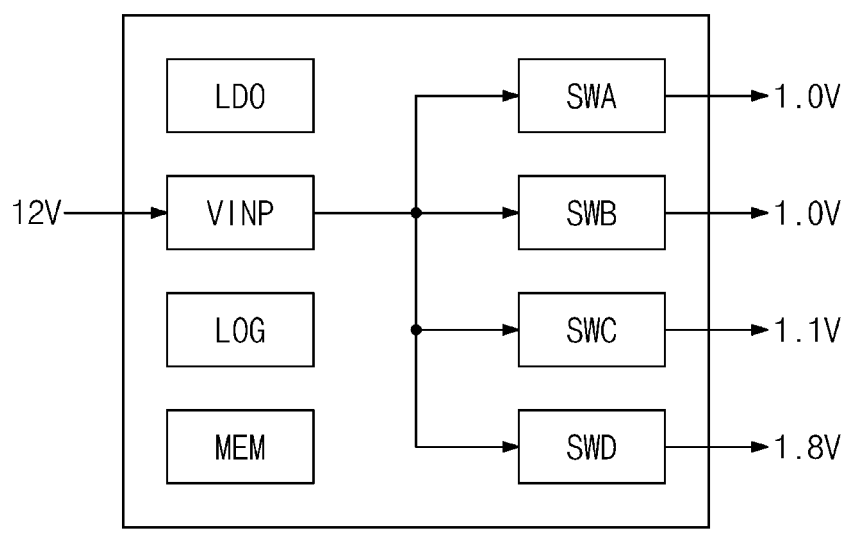
FIG. 24 illustrates a power management integrated circuit of the memory module of FIG. 23 including level shifters.

FIG. 24 illustrates power management integrated circuit 840 of FIG. 23. Power management integrated circuit 840 may include low drop-out regulator LDO, voltage input VINP, logic circuit LOG, memory MEM, and regulators SWA, SWB, SWC, and SWD. Regulator LDO may generate a power necessary for an internal operation. Logic circuit LOG may monitor a power management status and may output a signal informing the status to an external device. Memory MEM may store information necessary for power management.

The voltage input VINP may receive a voltage of 12 V. Each of regulators SWA and SWB may generate 1.0 V from the 12 V at voltage input VINP, regulator SWC may generate 1.1 V from the 12 V at voltage input VINP, and regulator SWD may generate 1.8 V from the 12 V at voltage input VINP. Each regulator described with reference to FIGS. 18 to 22 may include at least one level shifter such as any of the level shifters shown in FIGS. 1, 4, 9 and 12.

In an embodiment, electronic devices, which use a voltage of 5 V or higher, such as for example televisions (TVs), smart TVs, smartphones, electronic devices, and voltage converters may include a voltage converter including at least one level shifter.

According to the inventive concepts, a level shifter quickly changes voltage levels stored at a latch by using a one-shot pulse. Accordingly, a level shifter that operates at improved speed and operates even at low voltages, and an operating method of the level shifter, are provided.

While the inventive concepts have been described with reference to exemplary embodiments thereof, it should be apparent to those of ordinary skill in the art that various changes and modifications may be made thereto without departing from the spirit and scope of the inventive concepts as set forth in the following claims.

What is claimed is:

1. A level shifter comprising:
an input block configured to receive an input voltage swinging between a first ground voltage and a first power supply voltage, and to connect one node of a first node and a second node of the input block to a first ground node at which the first ground voltage is supplied, in response to the input voltage;
a shifting block connected to the first node through a first shifting block transistor and to the second node through a second shifting block transistor, the shifting block configured to store complementary voltage levels swinging between a second ground voltage and a second power supply voltage at a third node and a fourth node of the shifting block, and to mutually exchange the complementary voltage levels of the third and fourth nodes with each other in response to a current flowing through the one node, wherein the shifting block further comprises a first diode connected between the third node and gates of the first and second shifting block transistors and a second diode connected between the fourth node and the gates of the first and second shifting block transistors;
a pulse generator configured to generate a first pulse and a second pulse in response to the input voltage;
a first transistor configured to directly connect the third node to the first ground node in response to the first pulse; and
a second transistor configured to directly connect the fourth node to the first ground node in response to the second pulse.

2. The level shifter of claim 1, wherein when the input voltage becomes the first power supply voltage, a voltage level from among the complementary voltage levels of the shifting block and corresponding to the third node becomes the second ground voltage, and a voltage level from among the complementary voltage levels of the shifting block and corresponding to the fourth node becomes the second power supply voltage.

3. The level shifter of claim 2, wherein when the input voltage becomes the first power supply voltage, the pulse generator is configured to generate the first pulse, and
the first transistor is configured to directly connect the third node to the first ground node in response to the first pulse.

4. The level shifter of claim 1, wherein when the input voltage becomes the first ground voltage, a voltage level from among the complementary voltage levels of the shifting block and corresponding to the fourth node becomes the second ground voltage, and a voltage level from among the complementary voltage levels of the shifting block and corresponding to the third node becomes the second power supply voltage.

5. The level shifter of claim 4, wherein when the input voltage becomes the first ground voltage, the pulse generator is configured to generate the second pulse, and
the second transistor is configured to directly connect the fourth node to the first ground node in response to the second pulse.

6. The level shifter of claim 1, wherein a length of a period during which each of the first pulse and the second pulse is at a high level is shorter than a length of a period during which the input voltage is at the first power supply voltage and shorter than a length of a period during which the input voltage is at the first ground voltage.

7. The level shifter of claim 1, wherein the input block comprises:
a first input block transistor operating in response to the input voltage and connected between the first node and the first ground node;
an inverter configured to invert the input voltage and output an inverted voltage corresponding to an inverted version of the input voltage; and
a second input block transistor operating in response to the inverted voltage output from the inverter and connected between the second node and the first ground node.

8. A level shifter comprising:
an input block configured to receive an input voltage swinging between a first ground voltage and a first power supply voltage, and to connect one node of a first node and a second node of the input block to a first ground node at which the first ground voltage is supplied, in response to the input voltage;
a shifting block configured to store complementary voltage levels swinging between a second ground voltage and a second power supply voltage at a third node and a fourth node of the shifting block, and to mutually exchange the complementary voltage levels of the third and fourth nodes with each other in response to a current flowing through the one node;
a pulse generator configured to generate a first pulse and a second pulse in response to the input voltage;
a first transistor configured to directly connect the third node to the first ground node in response to the first pulse; and
a second transistor configured to directly connect the fourth node to the first ground node in response to the second pulse,
wherein the shifting block comprises:
a first shifting block transistor operating in response to the second ground voltage and connected between the first node and the third node;
a second shifting block transistor operating in response to the second ground voltage and connected between the second node and the fourth node;
a third shifting block transistor connected between the third node and a second ground node to which the second ground voltage is supplied, and having a gate connected with the second ground node;
a fourth shifting block transistor connected between the fourth node and the second ground node, and having a gate connected with the second ground node;
a fifth shifting block transistor connected between a second power node to which the second power supply voltage is supplied and the third node, and having a gate connected with the fourth node; and
a sixth shifting block transistor connected between the second power node and the fourth node, and having a gate connected with the third node.

9. The level shifter of claim 1, further comprising:
a signal transfer block configured to store and output a voltage level from among the complementary voltage levels and corresponding to the fourth node,
wherein the signal transfer block comprises:
a latch connected with a second ground node to which the second ground voltage is supplied;
a first signal transfer block transistor connected between a first end of the latch and a second power node to which the second power supply voltage is supplied, and operating in response to a voltage level from among the complementary voltage levels and corresponding to the third node; and a second signal transfer block transistor connected between a second end of the latch and the second power node, and operating in response to the voltage level corresponding to the fourth node.

10. The level shifter of claim 9, further comprising at least one inverter connected to the first end of the latch.

11. The level shifter of claim 1, further comprising at least one inverter connected with the fourth node.

12. The level shifter of claim 1, wherein the pulse generator comprises:
   a first inverter and a second inverter each receiving the input voltage;
   a third inverter receiving an output of the first inverter;
   a delay unit delaying an output of the second inverter;
   a fourth inverter receiving an output of the delay unit;
   a fifth inverter receiving an output of the fourth inverter;
   a first logic gate configured to perform a NAND operation on an output of the third inverter and an output of the fifth inverter;
   a second logic gate configured to perform a NAND operation on the output of the first inverter and the output of the fourth inverter;
   a sixth inverter inverting an output of the first logic gate and outputting the first pulse; and
   a seventh inverter inverting an output of the second logic gate and outputting the second pulse.

13. The level shifter of claim 1, wherein the second ground voltage is greater than the first ground voltage, and the second power supply voltage is greater than the first power supply voltage.

14. A level shifter comprising:
   an input block configured to receive an input voltage swinging between a first ground voltage and a first power supply voltage, and to connect one node of a first node and a second node of the input block to a first power node at which the first power supply voltage is supplied in response to the input voltage;
   a shifting block connected to the first node through a first shifting block transistor and to the second node through a second shifting block transistor, the shifting block configured to store complementary voltage levels swinging between a second ground voltage and a second power supply voltage at a third node and a fourth node of the shifting block, and to mutually exchange the complementary voltage levels of the third and fourth nodes with each other in response to a current flowing through the one node, wherein the shifting block further comprises a first diode connected between the third node and gates of the first and second shifting block transistors and a second diode connected between the fourth node and the gates of the first and second shifting block transistors;
   a pulse generator configured to generate a first pulse and a second pulse in response to the input voltage;
   a first transistor configured to directly connect the third node to the first power node in response to the first pulse; and
   a second transistor configured to directly connect the fourth node to the first power node in response to the second pulse.

15. The level shifter of claim 14, wherein when the input voltage becomes the first ground voltage, a voltage level from among the complementary voltage levels of the shifting block and corresponding to the third node becomes the second power supply voltage, and a voltage level from among the complementary voltage levels of the shifting block and corresponding to the fourth node becomes the second ground voltage, and
   wherein when the input voltage becomes the first power supply voltage, the pulse generator is configured to generate the first pulse, and the first transistor is configured to directly connect the third node to the first power node in response to the first pulse.

16. The level shifter of claim 14, wherein when the input voltage becomes the first power supply voltage, a voltage level from among the complementary voltage levels of the shifting block and corresponding to the fourth node becomes the second power supply voltage, and a voltage level from among the complementary voltage levels of the shifting block and corresponding to the third node becomes the second ground voltage, and
   wherein when the input voltage becomes the first power supply voltage, the pulse generator is configured to generate the second pulse, and the second transistor is configured to directly connect the fourth node to the first power node in response to the second pulse.

17. The level shifter of claim 14, wherein the pulse generator comprises:
   a first inverter and a second inverter each receiving the input voltage;
   a third inverter receiving an output of the first inverter;
   a delay unit delaying an output of the second inverter;
   a fourth inverter receiving an output of the delay unit;
   a fifth inverter receiving an output of the fourth inverter;
   a first logic gate configured to perform an AND operation on an output of the third inverter and an output of the fifth inverter;
   a second logic gate configured to perform an AND operation on the output of the first inverter and the output of the fourth inverter;
   a sixth inverter inverting an output of the first logic gate and outputting the first pulse; and
   a seventh inverter inverting an output of the second logic gate and outputting the second pulse.

18. The level shifter of claim 1, wherein the first and second shifting block transistors are PMOS transistors gated to the second ground voltage.

19. The level shifter of claim 14, wherein the first and second shifting block transistors are NMOS transistors gated to the second power supply voltage.

* * * * *